United States Patent
Motoi et al.

(10) Patent No.: US 7,902,637 B2
(45) Date of Patent: Mar. 8, 2011

(54) NANO STRUCTURE AND METHOD OF MANUFACTURING NANO STRUCTURE

(75) Inventors: Taiko Motoi, Atsugi (JP); Kenji Tamamori, Ebina (JP); Shinan Wang, Kashiwa (JP); Masahiko Okunuki, Akiruno (JP); Haruhito Ono, Minamiashigara (JP); Toshiaki Aiba, Fujisawa (JP); Nobuki Yoshimatsu, Cambridge (GB)

(73) Assignee: Canon Kabushiki Kaisha, Tokyo (JP)

( * ) Notice: Subject to any disclaimer, the term of this patent is extended or adjusted under 35 U.S.C. 154(b) by 209 days.

(21) Appl. No.: 12/109,701

(22) Filed: Apr. 25, 2008

(65) Prior Publication Data

US 2009/0315153 A1    Dec. 24, 2009

(30) Foreign Application Priority Data

May 15, 2007   (JP) .................................. 2007-128789
Mar. 25, 2008   (JP) .................................. 2008-077106

(51) Int. Cl.
    H01L 29/06    (2006.01)
    H01L 21/302   (2006.01)
(52) U.S. Cl. ........................ 257/618; 257/496; 257/596
(58) Field of Classification Search .................. 257/347, 257/496, 596–597, 613–618, E21.214, E29.005
See application file for complete search history.

(56) References Cited

U.S. PATENT DOCUMENTS

| | | | |
|---|---|---|---|
| 5,236,547 A | 8/1993 | Takahashi et al. | |
| 6,998,319 B2 * | 2/2006 | Tanaka et al. | 438/302 |

FOREIGN PATENT DOCUMENTS

| | | |
|---|---|---|
| JP | 58-151027 | 9/1983 |
| JP | 4-190984 | 7/1992 |
| JP | 2002-368307 | 12/2002 |
| WO | 2003/015145 | 2/2003 |

* cited by examiner

*Primary Examiner* — Cuong Q Nguyen
(74) *Attorney, Agent, or Firm* — Fitzpatrick, Cella, Harper & Scinto

(57) ABSTRACT

A nano structure formed on the surface of a substrate containing Si and having a pattern of at least 2 μm in depth, in which Ga or In is contained in the surface of the pattern, and the Ga or the In has a concentration distribution that an elemental composition ratio Ga/Si or In/Si of Si and Ga or In detected by an X-ray photoelectron spectroscopy is at least 0.4 atomic percent in the depth direction of the substrate, and the maximum value of the concentration is positioned within 50 nm of the surface of the pattern.

7 Claims, 21 Drawing Sheets

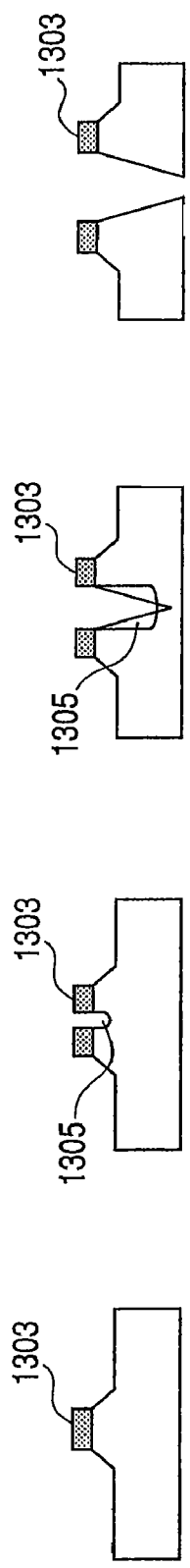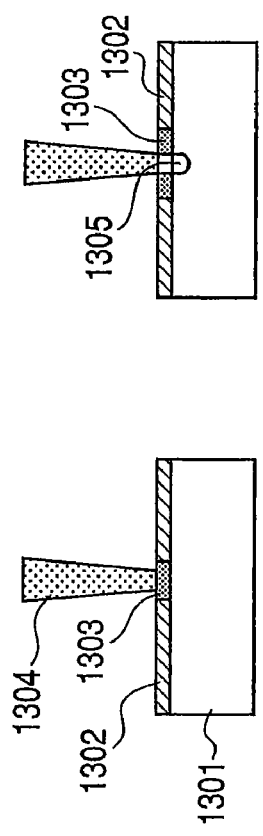

NANO STRUCTURE AND METHOD OF MANUFACTURING NANO STRUCTURE

BACKGROUND OF THE INVENTION

This application claims the benefit of Japanese Patent Application No. 2007-128789, filed May 15, 2007, and No. 2008-077106, filed Mar. 25, 2008, which are hereby incorporated by reference herein in their entirety.

FIELD OF THE INVENTION

The present invention relates to a nano structure and a method of manufacturing a nano structure.

RELATED BACKGROUND ART

In recent years, accompanied with the high integration of semiconductor integrated circuits, demand has further increased for forming a fine pattern having a high accuracy.

Heretofore, a pattern forming method using photolithography has been used for the formation of a microstructure.

In the pattern formation by this method, a photosensitizing agent, such as a resist, is applied to a substrate to form a resist film, and after that, this film is exposed and developed on the resist through a photo-mask from a light source such as an ultraviolet ray.

A pattern is transferred on the resist film, and, with this as a mask, a technique for etching the substrate is adopted. After the completion of the processing of the substrate, the resist film is stripped.

In the pattern forming method by this photolithography, a resolving power depends on the wavelength of the light source, and it is particularly difficult to form a pattern having a line width half or less than that of the wavelength of the light source being used.

For example, when a mercury lamp is used as a light source, the wavelength is 365 nm, and when a KrF excimer laser is used, the wavelength is 248 nm.

Consequently, it is difficult to form a pattern having a line width of 500 nm or less by using these light sources. Further, it is difficult to form a pattern having a line width of 100 nm or less. In a case in which such a fine pattern is formed, when it is processed up to the depth of, particularly, 2 µm or more, and, particularly, 10 µm or more, maintaining the processing accuracy becomes more difficult.

Hence, in the formation of the micro pattern having a line width of 500 nm or less (particularly, 100 nm or less), instead of the ultraviolet ray, an electron beam or an ion beam accelerated to 20 to 200 kV is used.

These are referred to as electron beam lithography and ion beam lithography, respectively.

In these electron beam and ion beam lithography techniques, a photo mask is not used, and a pattern can be directly drawn on a resist film by the electron beam or the ion beam.

Further, in recent years, a focus ion beam (FIB) is adopted into a semiconductor manufacturing step.

For example, a pattern forming method of a stepped pattern by the ion beam is proposed in the later part of U.S. Pat. No. 5,236,547, similarly as shown in FIGS. 14, 15A and 15B. FIG. 14 illustrates plots 141 and 142 of ion concentration for the depth of the pattern in the ion beams at low acceleration and high acceleration, respectively. In FIGS. 15A and 15B, reference numeral 1201 denotes a GaAs substrate, reference numeral 1202 denotes a SiNx film, reference numeral 1202*a* an ion injecting portion, reference numeral 1202*b* a stepped pattern, reference numeral 1203 a Ga ion, and reference numeral 1204 a CF$_4$ radical.

In this method, at least one of the accelerating voltage of the ion beam, atomic species of the ion, and ion valence is changed, thereby to inject an ion, and after an ion concentration peak area in the depth direction of an etching material is formed, the formation of the stepped pattern is performed by dry etching. Further, international publication WO 03/015145 A1 proposed an implanting process in which, as shown in FIGS. 16A1 to 16D2, a Ga ion is implanted into the GaAs substrate under the presence of a surface oxide film or under the irradiation of oxygen molecules. FIGS. 16A1, 16B1, 16C1 and 16D1 illustrate an aspect after the ion implanting, and FIGS. 16A2, 16B2, 16C2, and 16D2 illustrate an aspect after the etching of an atom layer. The dose amount of the Ga ion in FIGS. 16A, 16B, 16C, and 16D is $6\times10^{13}$, $6\times10^{14}$, $6\times10^{15}$, $6\times10^{17}$, pcs/cm$^2$, respectively. In FIGS. 16A1 to 16D2, reference numeral 1301 denotes a GaAs layer, reference numeral 1302 a natural oxide film, reference numeral 1303 an oxide film Ga$_2$O$_3$, reference numeral 1304 a Ga ion beam, and reference numeral 1305 the GaAs layer with the Ga ion injected thereto.

Further, Japanese Patent Application Laid-Open No. H04-190984 proposed a method of forming a micro machine, as shown in FIG. 17. In FIG. 17, reference numeral 1401 denotes a Si base substrate, and reference numeral 1402, a focused ion beam. This method adopts a technique in which the Si substrate is directly irradiated by the FIB, such as O, Be, and N, while the accelerated voltage is controlled, thereby to form the micro machine by forming a Si compound area.

Further, Japanese Patent Application Laid-Open No. 2002-368307 discloses a method of manufacturing a magnetoresistance effect film, as illustrated in FIGS. 18A, 18B, and 18C. In these figures, reference numeral 1511 denotes a Si substrate, reference numeral 1512 denotes a laminated film of metallic ferromagnetic layer/insulating layer/metallic ferromagnetic layer, reference numeral 1513 denotes an inorganic resist containing Si, reference numeral 1514 denotes a Ga ion beam, reference numeral 1515 denotes an electron beam, reference numeral 1516 denotes an F based dry etching, reference numeral 1517 denotes a fluorinated gallium compound, and reference numeral 1518 denotes a resist mask.

This is a method of irradiating an electrically neutralized ion beam when the Ga ion beam is injected into a Si containing inorganic resist by irradiating an electron beam in the vicinity of that area.

Further, U.S. Pat. No. 5,236,547 discloses a patterning method, in which Ga ions are implanted into a mask material, such as the SiNx film, as illustrated in FIGS. 19A, 19B, and 19C, thereby etching the mask material.

Further, Japanese Patent Application No. S58-151027 proposed an etching method, as illustrated in FIGS. 20A, 20B, 20C, and 20D. In FIGS. 20A, 20B, 20C, and 20D, reference numeral 1702 denotes an insulating film, reference numeral 1703 denotes a silicon wafer, reference numeral 1704 denotes an ion implanting area, and reference numeral 1705 denotes a non-implanting area. This method is an etching method, in which an ion is implanted with the insulating film on the silicon substrate taken as a mask, and dry etching is performed, thereby forming a step of about 100 nm without a side etching. Further, Japanese Patent Application No. S58-151027 proposes an apparatus at the same time, in which the ion implanting and the dry etching, as illustrated in FIG. 21, are performed in parallel.

In FIG. 21, reference numeral 1711 denotes an ion source, reference numeral 1712 denotes an ion, reference numeral 1713 denotes a magnet to perform a mass separation of the ion, reference numeral 1714 denotes a plasma reaction layer, reference numeral 1715 denotes a work piece object, and reference numeral 1716 denotes a plasma. A method is also proposed, in which the ion implanting and the dry etching are performed in parallel by using such an apparatus.

However, in the pattern forming method by the conventional photolithography, the pattern formation of an extremely fine line width (particularly, 100 nm or less) is difficult. When the line width is processed up to the depth of, particularly, 2 µm or more, and, particularly, 10 µm or more, maintaining the processing accuracy becomes more difficult.

For example, when an attempt is made to fabricate a structure having a depth of 2 µm or more with the resist film as a mask, it is necessary to increase the thickness of the resist film, in order to endure the etching.

Hence, the pattern formation by the line width of 500 nm or less, particularly, 100 nm or less, is difficult.

Further, in the forming method of the stepped pattern according to U.S. Pat. No. 5,236,547, when a mask having concentration peaks at several ion injection depths is formed, it is necessary to change at least one of the accelerated voltage, the atomic species of the ion, and the ion valence and to perform the ion injection. Hence, the change of a condition and the outputting of a condition take time and labor, and, in addition, the etching of the depth of 2 µm or more, and, particularly, 10 µm or more, is difficult. Further, as illustrated in FIG. 14, according to this technique, the implanted ion concentration peak becomes a concentration distribution having the maximal value, not at the uppermost surface of the substrate, but at several injection depths.

Further, in the processing method of implanting the Ga ions according to international publication WO 2003/015145 A1, also, the processing of the GaAs substrate requires heat processing at a high temperature of about 500° C.

Further, in the method of forming the micro machine according to Japanese Patent Application Laid-Open No. H04-190984, since a light element, such as oxygen, is ionized at the pressurized voltage of 40 to 1000 kV or more, a beam spot is about 0.1 µm, and for this reason, the processing of several µm order only can be performed. Further, for the formation of a high aspect step, an application of a higher voltage is required, and therefore, not only is there a limit of the voltage application, but also, as the injection depth becomes deeper, the large lateral spread of the injected ions is produced. Hence, this is not suitable for the high aspect micro pattern formation.

Further, Japanese Patent Application Laid-Open No. 2002-368307, described above, discloses a technique for patterning the Si containing inorganic resist in order to perform the etching of the laminated layer, including a metal magnetic layer. Consequently, after patterning the resist, a process is performed in which the laminated layer, including a lower metal magnetic layer, is further etched, and moreover, the resist is stripped. Further, at the injection time of the Ga ions, since the electron beam is irradiated in the vicinity of that area, the positional accuracy of the Ga ion injection area is affected by the electron beam. This makes it difficult to output the condition of the electron beam irradiation with a good positional accuracy.

Further, U.S. Pat. No. 5,236,547, described above, discloses a technique in which a thin film, such as SiNx and $SiO_2$ on a Si substrate, is used as a mask material, and ions are injected into the mask material. When these processes are used for electronic devices, the Ga ions are likely to affect the device performance, and a high temperature heating process for stripping the mask material containing Ga and taking out the injected Ga is required.

Further, according to Japanese Patent Application No. S58-151027, described above, various ions also can be directly implanted on the entire Si substrate. However, when looking at the ion implanting method of FIG. 21, though this method is configured to deflect ions so as to be irradiated on the substrate, no mention is made of a configuration and an aperture for focusing ions. Consequently, to form the fine pattern, a Si wafer is patterned with a mask, such as an insulating layer, and after that, ion injection is performed, the mask material is removed, and the etching of a non-implanting area is required to be performed. In this method, since ions are configured not to be sufficiently focused as compared with the FIB, the patterning of 100 nm or less is difficult if the mask is not used.

Such a method is difficult to obtain a high etching selection ratio with the mask and the etching material, and therefore, it is difficult to form a structure having a depth of 2 µm or more (particularly, 10 µm or more) with good shape control properties. Particularly, it is difficult to form a high aspect structure, that is, a structure being narrow in width against the depth or the height. Particularly, this is not suitable for the fine pattern, which requires a deep dig (discussed below) with a width of submicrons (particularly, 500 nm or less) and a depth of 2 µm or more.

In view of the above-described problems, an object of the present invention is to provide a nano structure having a pattern of 2 µm or more in depth formed on the surface of the substrate containing Si.

Further, an object of the present invention is to provide a method capable of manufacturing a nano structure having a pattern with a high aspect and a nano order on the substrate containing Si.

The nano structure of the present invention means a structure having a depth of 2 µm or more (particularly, 10 µm or more), such as MEMS (micro electro mechanical system), NEMS (nano electro mechanical system), and an optical device.

SUMMARY OF THE INVENTION

The present invention provides a nano structure and a method of manufacturing a nano structure, configured as follows.

The nano structure of the present invention is a nano structure having a pattern of 2 µm or more in depth formed on the surface of a substrate containing Si, wherein Ga or In is contained in the surface of the pattern, and the Ga or the In has a predetermined concentration distribution in the depth direction of the substrate, and the maximum value of the concentration is positioned on the uppermost surface layer of the pattern.

Further, the method of manufacturing the nano structure of the present invention is a method for manufacturing the nano structure by using the substrate containing Si by etching, and includes a process of irradiating a focused Ga ion or In ion beam on the surface of the substrate containing the Si and injecting the Ga ions or In ions, while sputtering away the surface of the substrate, and forming a layer containing Ga or In on the surface of the substrate, and a process of performing a dry etching (also referred to as a deep dig etching) by a gas containing fluorine (F), with the layer containing Ga or In formed on the surface of the substrate taken as an etching mask, and forming a nano structure having a pattern of 2 µm or more in depth according to a predetermined line width. The deep dig etching process referred to here means an RIE (Reactive Ion Etching) process of the structure whose aspect ratio (a ratio of the depth and the width) is particularly 5 or more. As an example of this process, there is a known Bosch type RIE process.

Further, the method of manufacturing the nano structure of the present invention is a method for manufacturing a nano structure by using a substrate containing Si and having a concavo-convex pattern at a predetermined pitch on the substrate surface by etching, and includes, when the Ga ions or the In ions focused on the surface of the substrate containing the Si are irradiated, a process of scanning the Ga ions or the In ions and forming a layer containing the Ga or the In on the surface of the substrate at a predetermined pitch, and a process of performing a dry etching by the gas containing a fluorine (F) with the layer containing the Ga or the In formed at a predetermined pitch on the surface of the substrate taken as an etching mask, and forming a nano structure having a concavo-convex pattern at a predetermined pitch and line width.

Further, the method of manufacturing the nano structure of the present invention is a method for manufacturing a nano structure having the stepped patterns of plural stages on the substrate surface by using the substrate containing Si by etching, and includes a process of forming the stepped pattern on the surface of the substrate, a process of irradiating the focused Ga or In ions on the stepped pattern formed on the substrate surface and forming a layer containing the Ga or In on the surface of the substrate, and a process of subjecting the surface of the substrate to a deep dig processing by dry etching by the gas containing a fluorine (F) with the layer containing the Ga or the In formed on the surface of the substrate taken as an etching mask and forming the stepped patterns of plural stages.

According to the present invention, a nano structure formed on the surface of a substrate containing Si and having a pattern of 2 μm or more in depth can be realized.

Further, the present invention can realize a nano structure having a pattern of 500 nm or less and, particularly, 100 nm or less in line width and 2 μm or more in depth.

Further, according to the method of manufacturing the present invention, the nano structure having a high aspect pattern and a nano order can be manufactured on the surface of the substrate containing Si.

Further features of the present invention will become apparent from the following description of exemplary embodiments with reference to the attached drawings.

BRIEF DESCRIPTION OF THE DRAWINGS

FIG. 1A is a top plan view and FIG. 1B is a sectional view.

FIGS. 16A1, 16A2, 16B1, 16B2, 16C1, 16C2, 16D1 and 16D2 are views illustrating a dose amount and a pattern form in WO 2003/015145 A1, which is a conventional example.

DESCRIPTION OF THE EMBODIMENTS

Figure 1A:
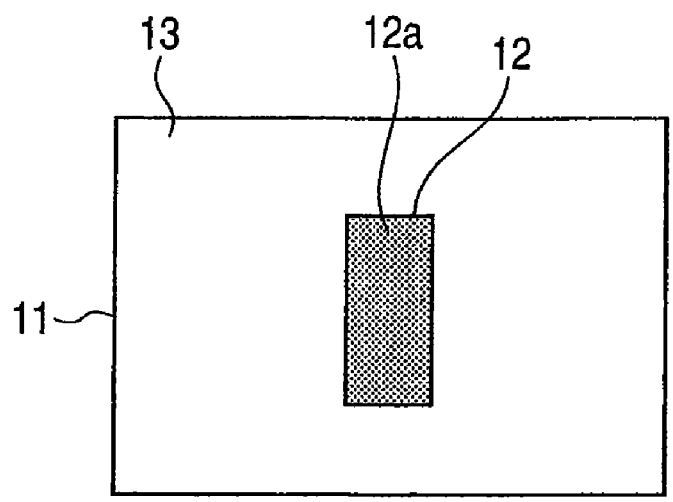
FIGS. 1A and 1B are views describing the configuration example of a nano structure having a pattern containing a desired Ga on the surface of a substrate containing Si in a first embodiment and an example 1 of the present invention.

As described above, according to the present invention, a nano structure having a depth of 2 μm or more directly on the surface of a structure containing Si can be obtained, and this is based on the result of intensive studies made by the present inventor and others.

That is, the present inventor and others have noticed that a mask performance sufficiently enduring an etching of the depth of 2 μm or more is necessary, and have conducted intensive studies on mask materials.

As a result, it was found that, when Ga is injected into a structure surface containing Si, a good mask performance can be obtained by controlling the concentration and the injection condition, and thus, the present invention has been completed. Specifically, a focused Ga ion beam is irradiated on the uppermost surface of the structure containing Si. Accompanied with this, Ga ions are injected, while the surface of the structure is slightly sputtered away.

Hence, different from the ordinary ion injection, an area in which the concentration of Ga in the uppermost surface vicinity has a peak is formed. That is, an area having a concentration distribution is formed.

Here, the uppermost surface vicinity is referred to as an area in which the maximum value of the concentration of Ga in the depth direction from the surface of the structure is distributed to be positioned at the uppermost surface layer (within 50 nm from the surface) of the structure. In the present invention, an area of the depth of 0 to 50 nm was defined as the uppermost surface layer (also including the uppermost surface). An ideal distribution of Ga is such that the area having the maximum value of the concentration in the depth direction of Ga is positioned at the uppermost surface layer.

In the present invention, the uppermost surface layer is preferably 0 to 50 nm, and more preferably, 0 to 20 nm, which substantially also includes the uppermost surface (0 nm). In the present invention, the substantial uppermost surface includes strictly not only the depth of 0 nm, but also, the distribution of the range within 10 nm.

Thus, by injecting Ga ions into the uppermost surface layer of the structure containing Si, while maintaining a specific distribution state as described above, a pattern having a sufficient mask performance can be formed even for the etching of 2 μm or more (particularly, 10 μm ore more) in depth.

Further, by specifying the injection area of the Ga ions to the uppermost surface of the structure containing Si, the accelerating voltage can be made small at the time of a Ga ion implanting process, and unnecessary damage to the structure containing Si can be suppressed.

As described above, by selectively injecting an infinitesimal amount of the Ga ions into the uppermost surface layer of the structure containing Si, an extremely high mask performance can be given for the etching, which has been unable to be achieved heretofore.

While, in the above, a description has been made that the etching depth can be made 2 μm or more, the etching depth can be controlled according to the etching condition, and it is a matter of course that the present invention can be applied, even in a case in which the depth is 1 μm or less.

Further, in the present invention, while an example of injecting the Ga ions on the structure surface containing Si has been shown, even when In is used in place of Ga, the same result can be expected.

Further, the nano structure of the present invention is applied to a structure having a depth of 2 μm or more, such as a MEMS, a NEMS, or an optical device, and the like.

First Embodiment

Next, a nano structure and a method of manufacturing the nano structure in a first embodiment of the present invention, to which a pattern forming method of the present invention is applied, will be described.

Figure 1B:
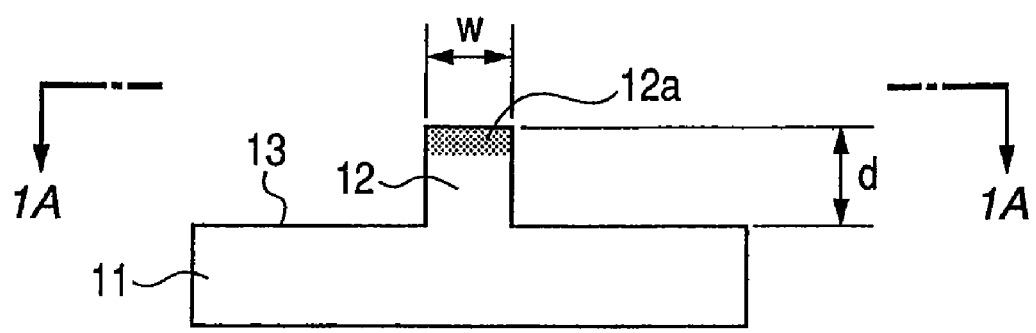

With reference to FIGS. 1A and 1B, a configuration example of the nano structure having a pattern containing a desired Ga on the surface of a substrate containing Si in the present embodiment will be described. FIG. 1A is a top plan view and FIG. 1B is a sectional view.

In FIGS. 1A and 1B, reference numeral 11 denotes a substrate, reference numeral 12 denotes a pattern, reference numeral 12a denotes a pattern surface, and reference numeral 13 denotes an etching bottom.

In the nano structure in the present embodiment, as the substrate 11, a substrate containing Si is used.

For example, not only a single substrate such as silicon, $SiO_2$, and SiN, but also, a silicon film on $SiO_2$, an SiN film on $SiO_2$, an $SiO_2$ film on silicon, an SiN film on silicon, a silicon film on SiN, and an $SiO_2$, film on an SiN film also can be used. Further, a film containing Si on an arbitrary substrate (for example, metal, glass, resin, and ceramics), and the like, can be used. The pattern surface 12a is a layer containing Ga on the surface. The pattern 12 includes the pattern surface 12a, and is formed of a protruding portion formed on the substrate 11.

Although a pattern width W can be 100 nm or less, it can be about several hundreds of μm when Ga/Si is 0.4 atomic percent or more.

A distance d between the pattern surface 12a and the etching bottom 13, that is, an etching depth is assumed to be 2 μm or more.

While, in the above, a description has been made of a case using Ga, the case using In also can expect the same result as the case Ga, when In/Si is 0.4 atomic percent or more.

Here, a Ga concentration in the pattern surface 12a was confirmed by a Transmission Electron Microscopy (TEM), a Secondary Ion-Microprobe Mass Spectrometry (SIMS), and an X-ray Photoelectron Spectroscopy (XPS).

Further, to improve surface analysis accuracy, a Ga injection area equal to the pattern 12a was formed at the substrate end portion with a size of about 200 μm square.

Particularly, when the concentration in the depth direction of Ga in the Ga injection area equal to the pattern surface 12a on the pattern 12 fabricated with a line width W of 100 nm was analyzed, the following result was obtained. First, an analysis was made by X-ray Photoelectron Spectroscopy (XPS), and an elemental composition ratio Ga/Si of Ga element and Si element was calculated. As a result, Ga/Si was 0.4 atomic percent or more.

Figure 2:
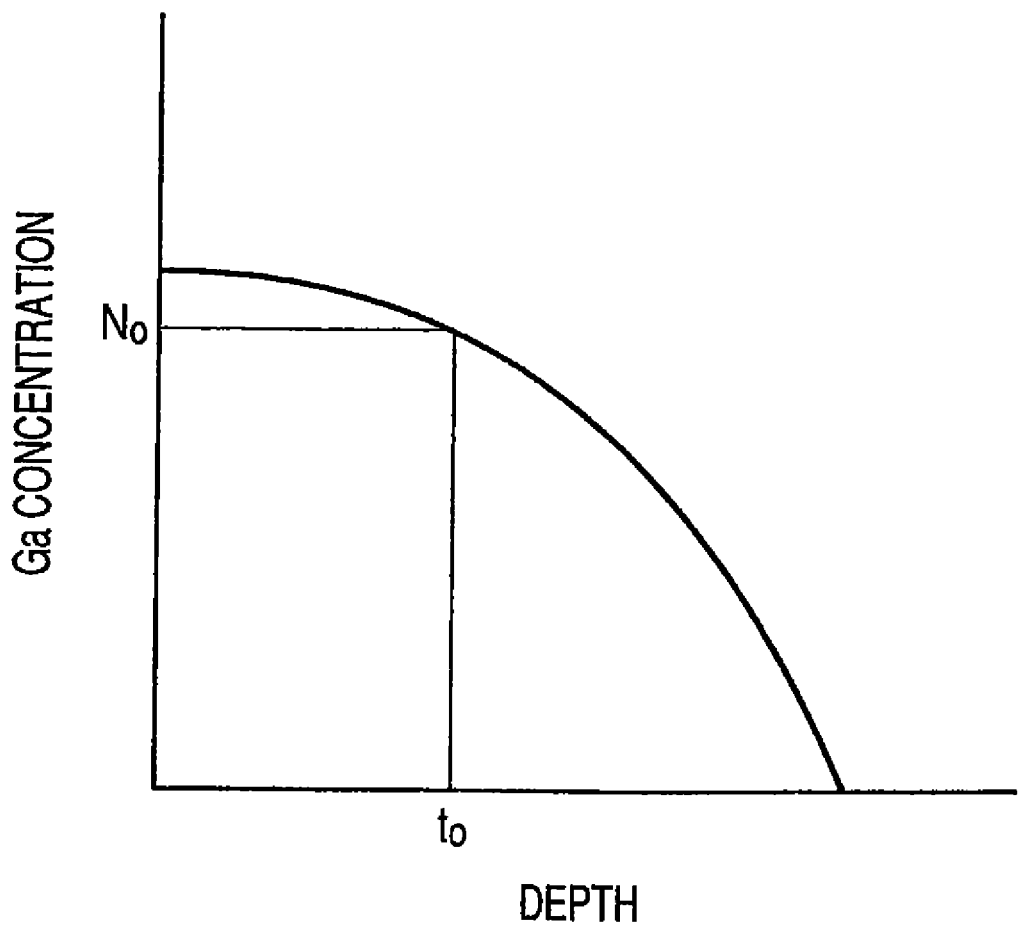
FIG. 2 is a view illustrating a concentration distribution in the depth direction of Ga in the nano structure of the first embodiment of the present invention.

Next, analysis and confirmation were made by Secondary Ion-Microprobe Mass Spectrometry (SIMS). As a result, a maximum value of the concentration provided in the uppermost surface vicinity, as shown in FIG. 2, was obtained.

This matches well with the value when a cross section TEM elementary analysis is carried out on the pattern surface 12a of FIGS. 1A and 1B.

Next, a method for manufacturing the nano structure of FIGS. 1A and 1B will be described.

Figure 4A:
FIGS. 4A, 4B, and 4C are views describing a method of manufacturing the nano structure in the first embodiment and the example 1 of the present invention.
Figure 4B:
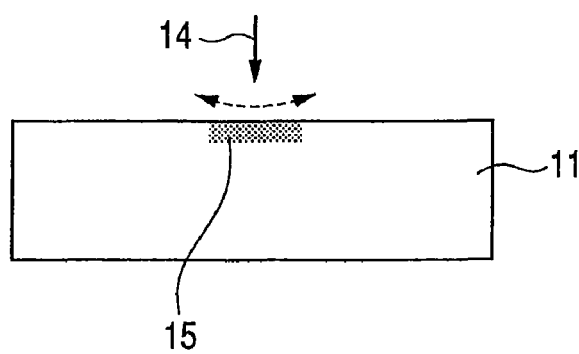
Figure 4C:
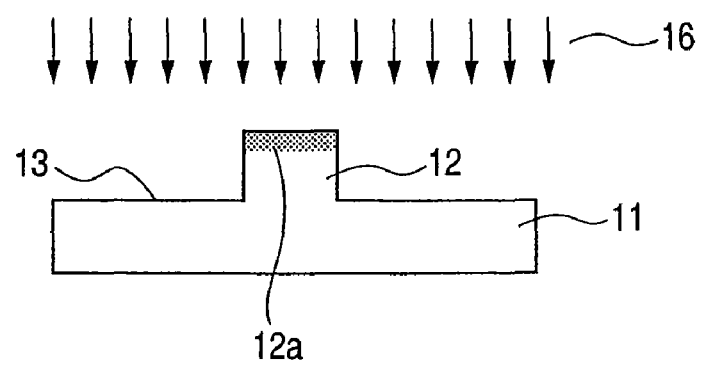

In FIGS. 4A, 4B, and 4C, a drawing describing on example of the method of manufacturing the nano structure in the present embodiment will be illustrated. Note that, in FIGS. 4A, 4B, and 4C, the same configuration as that of the first embodiment of FIGS. 1A and 1B is provided with the same reference numerals, and therefore, the description of the common parts will be omitted.

In FIGS. 4A, 4B, and 4C, reference numeral 14 denotes a focused ion beam (FIB), reference numeral 15 denotes an irradiation area of the focused ion beam (FIB), and reference numeral 16 denotes a reactive ion etching.

First, a substrate 11 sufficiently cleansed is introduced to a focused ion beam (FIB) apparatus (FIG. 4A), and the focused ion beam (FIB) apparatus (FIG. 4A), and the focused ion beam 14 by a Ga ion is irradiated to a desired position, and an irradiation area 15 of the focused ion beam (FIB) is formed (FIG. 4B).

In the focused ion beam (FIB) apparatus by the Ga ions, the beam can be focused to the resolution of 7 nm or less at the accelerating voltage of about 30 kV. Although the higher the accelerating voltage is, the higher the resolution becomes, under normal conditions, the apparatus is used under the conditions of about 30 to 40 Kv. In the present invention, it is important that a control can be made such that the depth of the area having the maximum value of the concentration of the injected ions are positioned at the uppermost surface (0 to 50 nm from the pattern surface).

Such an ion source excellently focused is different from the ordinary ion injection, and is mainly used for the surface processing.

For example, it is used such that, when a defect occurs in the device, such as a semiconductor wafer, to confirm its cross-sectional aspect, a desired position is minutely etching-processed and is removed by such a focused ion beam (FIB) apparatus by Ga ions.

Consequently, with respect to the materials frequently used by the device, such as an Si substrate and a quartz substrate, the relationship of the etching depth by the irradiation conditions is already obtained.

When an apparatus user specifies a beam on an apparatus monitor, and sets up a processing area and a processing depth, a processing time is automatically calculated according to that setting condition, and an etching can be made to the specified processing depth.

Further, the processing area can be easily controlled by performing an FIB scan only on the area specified on the monitor.

Consequently, when such a focused ion beam (FIB) apparatus by the Ga ions is used, a Ga ion injection amount also can be easily adjusted at the specified condition set at the specified position.

The pattern surface 12a to which ions are injected can confirm the injection amount by the surface analysis of the equal position. Here, the equal position is not only the position at which the ion injection is performed, but also, another position in which the ion injection is performed under the same condition or also includes another substrate made of the same material. In the analysis by the X-ray Photoelectron Spectroscopy (XPS), usually, the surface analysis can be made nondestructively, and usually, an estimation of information up to about 10 nm from the surface is made.

In the present embodiment, as described above, a Ga amount before etching was confirmed by the analysis by the X-ray Photoelectron Spectroscopy (XPS).

As a result, the knowledge was obtained by the present inventor and others that a mask effect for the etching can be exhibited by the injection amount of 0.4 atomic percent or more for the Si amount. The Ga amount by which the mask effect is exhibited is 0.4 atomic percent or more, and though there is no upper limit, when ion injection is performed more than necessary, not only does it take time, but also, it becomes one of the factors that increases the cost. Consequently, the Ga amount is preferably made 50 atomic percent or less.

Next, to confirm the Ga injection concentration in the depth direction before etching, an analysis was made by the Secondary Ion-Microprobe Mass Spectrometry (SIMS).

As a result, as described above, a result as illustrated in FIG. 2 was obtained. In the SIMS analysis, it is known that the uppermost surface of a specimen of about 2 nm has a profile disturbed. FIG. 2 illustrates a result with the influence removed therefrom.

The Ga ion injection amount capable of obtaining the sufficient mask performance requires an injection amount of about $5 \times 10^{14}/cm^2$ or more.

For example, when the Ga ions sufficiently focused by 30 kV are injected on the Si substrate for about $3.3 \times 10^{15}/cm^2$, it is injected while slightly sputtering away the surface.

Hence, at the depth of $t_0=6$ nm, a concentration of Ga concentration $N_0$=about $6.5 \times 10^{20}/cm^3$ (about 1.3 atomic percent) is obtained.

It is when the Ga ions are injected about $5 \times 10^{14}/cm^2$ or more that the distribution having such a concentration gradient is spread, and when the injection amount is small, the surface is not sputtered away, and thus, the Ga concentration of the uppermost surface becomes low.

For example, in the injection amount of $2 \times 10^{14}/cm^2$, the concentration gradient having the maximal value at the depth of about 20 nm is shown.

By controlling the accelerating voltage and the ion injection amount when injecting Ga in this manner, ions can be selectively injected on the uppermost surface layer.

In the present invention, the depth is preferably 0 to 50 nm, and more preferably, 0 to 30 nm, and most suitably, 0 to 20 nm.

When ions are injected such that the maximal value of the ion concentration is distributed to a deep position exceeding this range, the substrate serving as a base material is damaged, and this is undesirable.

Next, the substrate to which the Ga ions had been sufficiently injected was set to the reactive ion etching apparatus, and a reaction ion etching (also referred to as a deep dip RIE when a processing depth is above a certain depth level) 16 was performed in fluorine (F) atmosphere (FIG. 4C).

An introduced gas, for example, alternatively introduces $SF_6$ and $C_4F_8$, and performs an etching for a desired time.

The structure of 100 nm or less can be confirmed in its aspect by the scanning electron microscope (SEM).

To confirm a state during etching, the injection area of about 200 μm square formed on the substrate end portion for surface analysis can be observed by an optical microscope.

By monitoring its position, the position of the structure of 100 nm or less also can be estimated.

Figure 10:
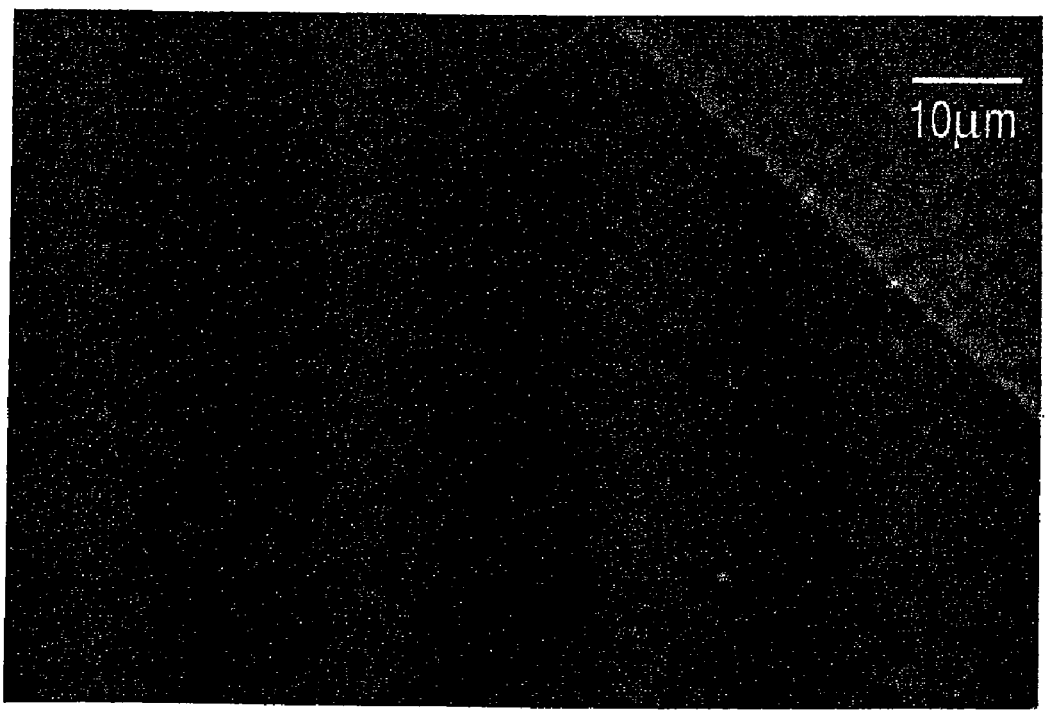
FIG. 10 is a view illustrating a scanning electron microscope (SEM) image of a pattern surface in the first embodiment of the present invention.

When the substrate, which obtained a sufficient step by the optical microscope, is estimated by the scanning electron microscope (SEM), as shown in FIG. 10, it was confirmed that the sufficient step was able to be obtained.

That is, when the Ga injection amount is about $5 \times 10^{15}/cm^2$ or more, the surface is smooth, and it was confirmed that the sufficient step of 2 μm or more was able to be obtained.

On the other hand, the position not sufficiently irradiated, for example, the irradiation position of the injection amount of about $2 \times 10^{14}/cm^2$ has a black area generated in a point-like state by the optical microscope.

When this position is observed by the scanning electron microscope (SEM), many thin needle-like pillars are observed, the concave-convexes of the irradiation position are wild, and the mask effect for the etching is also not recognized.

From this result, assuming the cause thereof, in the sufficiently focused Ga ion beams, by the injection of the ion beam above a certain level, the ion beam is continued to be irradiated, while slightly sputtering away the surface.

From this result, it is presumed that an area is formed in which the Ga concentration in the uppermost surface vicinity (the uppermost surface layer) has the maximum value, and this area has a function of improving an etching tolerability.

In the present embodiment, by scanning the sufficiently focused Ga ion beam on the structure surface, the surface is slightly sputtered away, while enabling to perform the ion injection at the same time.

Consequently, by injecting the Ga ions above a certain concentration level, ions can be injected so that the uppermost surface layer, which is a depth area of 0 to 50 nm from the uppermost surface vicinity, that is, the surface of the structure, is allowed to have the maximum value of the Ga concentration.

By forming an area having such a concentration gradient, a good pattern whose surface is smooth and having the etching tolerability of 2 µm or more can be formed.

Second Embodiment

Next, a method of manufacturing a nano structure for manufacturing the nano structure having a convexo-concave pattern by a predetermined pitch on the substrate surface by etching by using a substrate containing Si in a second embodiment of the present invention will be described.

Figure 5A:
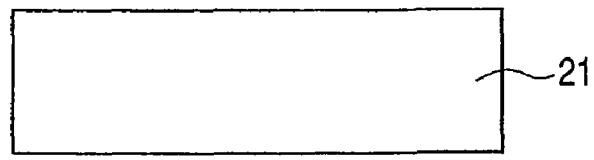
FIGS. 5A, 5B, and 5C are views describing a method of manufacturing the nano structure in a second embodiment and an example 3 of the present invention.
Figure 5B:
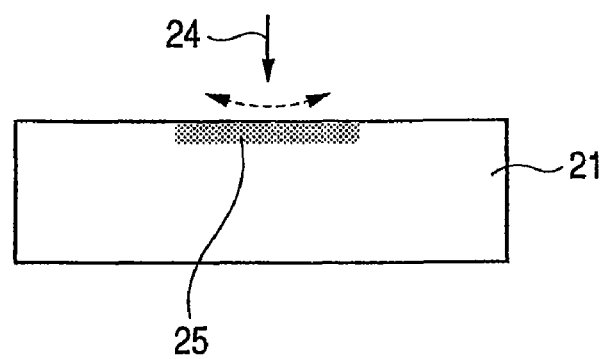
Figure 5C:
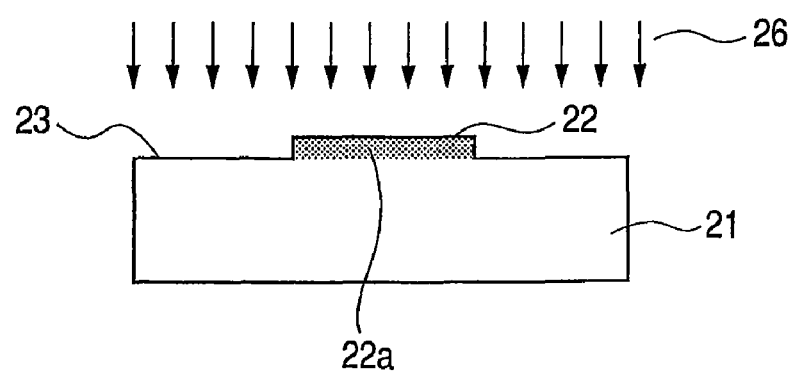

FIGS. 5A, 5B, and 5C are views describing a pattern forming method in the present embodiment.

In FIGS. 5A, 5B, and 5C, reference numeral 21 denotes a substrate containing Si, reference numeral 22 denotes a pattern, reference numeral 22a denotes a pattern surface, reference numeral 23 denotes an etching bottom, reference numeral 24 denotes a focused ion beam (FIB), reference numeral 25 denotes an FIB irradiated area, and reference numeral 26 denotes a reactive ion etching.

Figure 6:
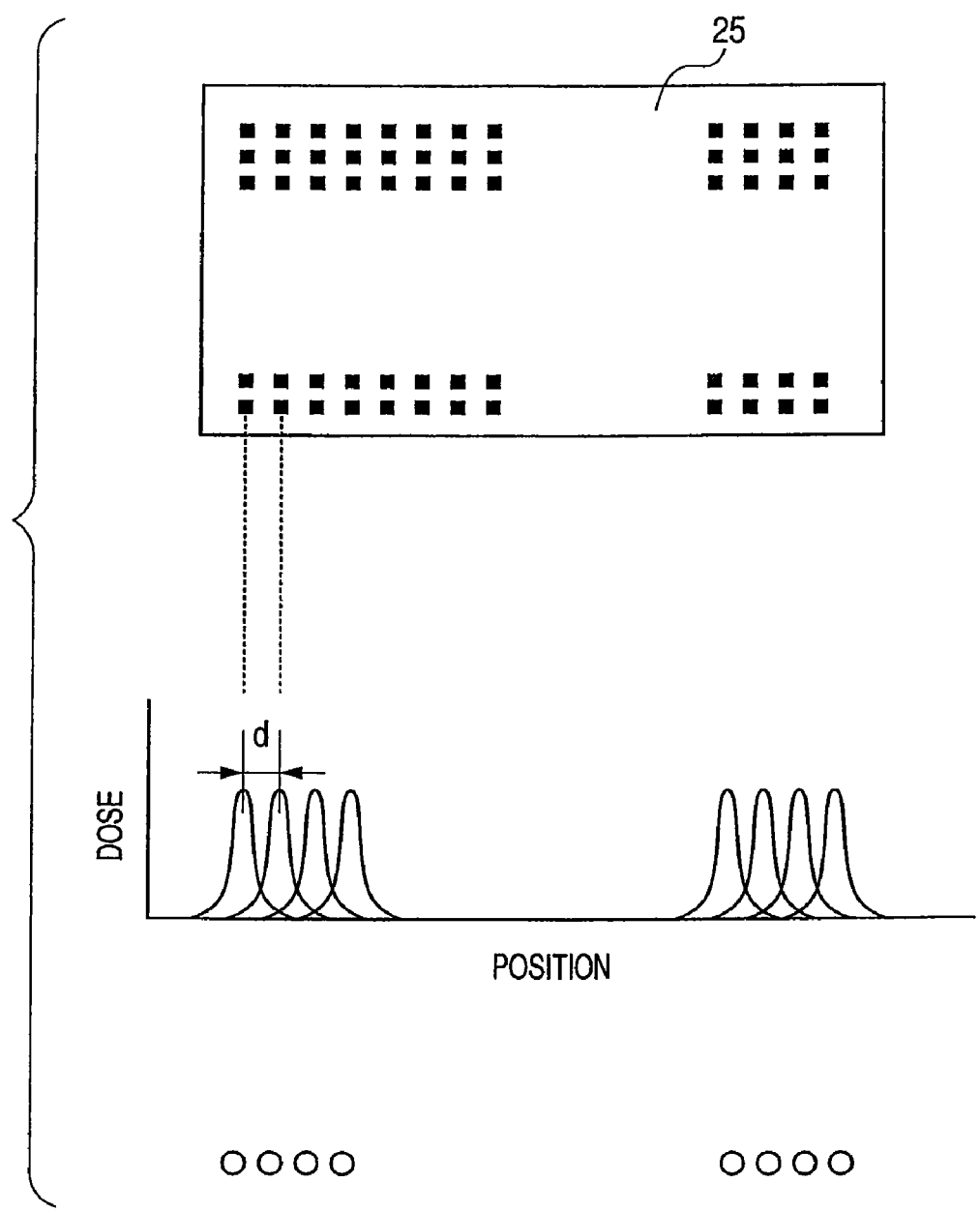
FIG. 6 is a schematic illustration illustrating one example of an FIB irradiation condition in the second embodiment of the present invention.

Further, in FIG. 6, one example of the irradiation condition of the focused ion beam (FIB) in the pattern forming method of the present embodiment is illustrated.

In FIG. 6, to the same regions as the regions shown in FIGS. 5A, 5B, and 5C are attached the same reference numerals as shown in FIGS. 5A, 5B, and 5C, and, one example of the dose amount and the position when the FIB was irradiated in the FIB irradiation area 25 at a pitch D is illustrated.

As a substrate 21, similarly as shown in FIGS. 1A and 1B, not only a single substrate such as silicon, $SiO_2$, and SiN, but also, the following substrate can be used. For example, a silicon film on $SiO_2$, an SiN film on $SiO_2$ film, an $SiO_2$ film on silicon, an SiN film on silicon, a silicon film on SiN, and an $SiO_2$ film on SiN also can be used.

Further, a film containing Si on an arbitrary substrate (for example, metal, glass, resin, ceramics) can be used. The pattern surface 22a is a layer containing Ga on the surface. The pattern 22 includes the pattern surface 22a, and is a convex portion having a convexo-concave surface on the surface formed on the substrate 21.

Although a pattern width W can be 500 nm or less, it can be about several hundreds of µm when Ga/Si is 0.4 atomic percent or more.

A distance D between the pattern surface 22a and the etching bottom 23, that is, an etching depth can be controlled by etching conditions, and can be made 1 µm or less and also 10 µm or more.

Next, a pattern forming method in the present embodiment will be described with reference to FIGS. 5A, 5B, and 5C and FIG. 6.

First, the substrate 21 sufficiently cleansed is introduced to an FIB apparatus (FIG. 5A), and Ga ions 24 are irradiated to a desired position, and a Ga ion irradiation area 25 is formed (FIG. 5B).

In a Ga ion FIB apparatus, the beam can be focused, for example, to the resolution of 5 to 7 nm or less at the accelerating voltage of about 30 kV.

Such an excellently focused ion source is different from the ordinary ion injection, and is mainly used for the surface processing.

For example, it is used such that, when a defect occurs in the device such as a semiconductor wafer, to confirm its cross-sectional aspect, a desired position is minutely etching-processed and is removed by such a Ga ion FIB apparatus.

Consequently, with respect to the materials frequently used by the device, such as a Si substrate and a quartz substrate, the relationship of the etching depth by the irradiation conditions is already obtained.

Consequently, when an apparatus user specifies a beam on an apparatus monitor by using such a focused ion beam (FIB) apparatus and sets up a processing area and a processing depth, a processing time is automatically calculated according to the setting condition, and an etching can be made to the specified processing depth.

Further, the processing area can be simply controlled by scanning only on the area specified on the monitor by a focused ion beam (FIB) apparatus. Consequently, a Ga ion injection amount also can be easily adjusted at the specified condition at the specified position.

Similarly, a pitch at the Ga ion irradiating time is taken as d, and the irradiation is performed such that the dose amount has an energy distribution in the direction inside the substrate.

The pitch d can be controlled to 1 µm or less. Further, according to need, a pitch of 1 µm or more also can be formed.

In FIG. 6, assuming that the pitch d=1 µm, the Ga ion injection is performed such that the pitch becomes about $5 \times 10^{14}/cm^2$ or more per point.

Next, the substrate 21, to which the Ga ions are sufficiently injected is set to the reactive ion etching apparatus, and a reactive ion etching 26 is performed in a fluorine (F) atmosphere (FIG. 5C).

An introduced gas, for example, alternatively introduces $SF_6$ and $C_4F_8$, and performs an etching for a desired time.

By using such gases, the side wall protection by the etching and the pattern can be alternatively performed, and it is, therefore, possible to obtain a good vertical deep dig pattern by this etching.

Further, in the deep dig RIE using the Ga mask, by adjusting the processing condition, the inclined angle, the flatness or the shape of the side wall can be controlled. The adjustment of the processing condition means that, when two operations of the side wall protection by the etching and the pattern are alternately performed, the time, the pressure inside the apparatus, the processing power, and the flow amount of $SF_6$ and $C_4F_8$ are tailored based on the object, and are optimally adjusted. By changing the etching time, the depth of the etching bottom 23 can be changed. By the etching for about several minutes, the pattern having a convexo-concave portion can be referenced.

According to the above-described manufacturing method, it is possible to manufacture a nano structure having a pattern of a high aspect and a nano order on the surface of the substrate containing Si.

EXAMPLES

Hereafter, while the examples of the present invention will be described, the present invention is not limited by them.

Example 1

In a first example 1, one example of fabricating a nano structure illustrated in FIGS. 1A and 1B will be described.

As the substrate 11, the Si substrate was used. The pattern width W was taken as 100 nm, and the etching depth was taken as 20 μm.

Since the manufacturing method of the nano structure in the present example is basically by the same process as the manufacturing method of the nano structure illustrated in FIGS. 4A, 4B, and 4C described in the embodiment of the present invention, a description will be made here by using FIGS. 4A, 4B, and 4C also.

First, the Si substrate 11 is set to the focused ion beams (FIB) apparatus (FIG. 4A). At that time, the Si substrate 11 is set so as to be vertical to the focus ion beam (FIB) 14. Although the focused ion beam (FIB) 14 is suitably adjusted in advance, before the irradiation, accuracy was confirmed in the substrate edge vicinity.

Five irradiation areas of 10 μm in length and a width W=100 nm are set in the center and two irradiation areas of 200 μm square for estimation are set on the end of the substrate, and the irradiation is performed by the focused ion beam (FIB), and seven ion beam irradiation areas 15 are fabricated on the surface of the substrate 11.

The condition at the irradiation time is based on an accelerating voltage of 30 kV and a beam current of 5 nA, and the irradiation time is adjusted such that the etching of about 50 nm is performed in the ordinary Si substrate processing (FIG. 4B). After the irradiation, when the beam was confirmed again at the substrate edge vicinity, the substrate was processed highly accurately.

Next, the substrate 11 on which the ion beam irradiation area 15 was fabricated by the focused ion beam (FIB) was taken out to perform an XPS surface analysis.

The ion beam irradiation area 15 has Ga detected, and the Ga amount for Si is about 7 atomic percent. In addition to Ga, 0, C, and the like, were also detected.

Next, this substrate 11 was set to the reactive ion etching apparatus, and a reactive ion etching 16 was performed in a fluorine (F) atmosphere. The introduced gas alternatively introduces $SF_6$ and $C_4F_8$, and an etching for about five minutes is performed (FIG. 4C).

By using such gases, the sidewall protection by the etching and the pattern can be alternatively performed, and it is, therefore, possible to obtain a good vertical deep dig pattern by this etching.

When the substrate 11 was taken out from the apparatus, and the etching depth was confirmed by the optical microscope, the depth was about 20 μm. Further, when the micro pattern of the substrate center portion was confirmed by the scanning electron microscope (SEM), it was found that the pattern surface 12a was flat, and the width W=about 100 nm, and the depth d=about 20 nm. It was confirmed that the pattern surface was etched equivalent to a 200 μm square irradiation area for estimation formed at the end of the substrate.

Next, the depth direction analysis of the 200 μm square irradiation area was performed by the SIMS. With respect to the Ga concentration, a profile, as illustrated in FIG. 2, was obtained. The Ga concentration was highest at the uppermost surface.

Comparative Example 1

In comparative example 1, the substrate equal to that in the example 1 was used, and an equal processing area was set. Thereby, the Ga ion beam irradiation was performed.

The accelerating voltage was set to 30 kV and the beam current was set to 5 nA, and the time was adjusted such that the irradiation time alone becomes about 1/10 of the example 1.

After the ion beam irradiation, when the XPS surface analysis of the 100 μm square area was performed, in the uppermost surface of the ion beam irradiation area, Ga was detected, and the Ga amount for Si was about 0.3 atomic percent. In addition to Ga, 0, C, and the like, were also detected.

Next, this substrate was subjected to the reactive ion etching under the condition equal to that in example 1.

When the substrate was observed by the optical microscope and the scanning electron microscope (SEM), the concave-convexes of the pattern surface were wild, and it was found that the etching tolerability of the irradiation position is insufficient. The depth d was at the level of 1 μm or less, which was hardly measurable.

Example 2

In an example 2, the substrate surface equal to that in example 1 was subjected to a fluorine acid processing, and the substrate with a surface oxide layer removed therefrom was used.

The Ga ion irradiation was performed under the condition equal to that in example 1. When the XPS analysis was performed similarly to that in example 1, the ion beam irradiation area 15 had Ga detected, and the Ga amount for Si was about 6 atomic percent.

Figure 3:
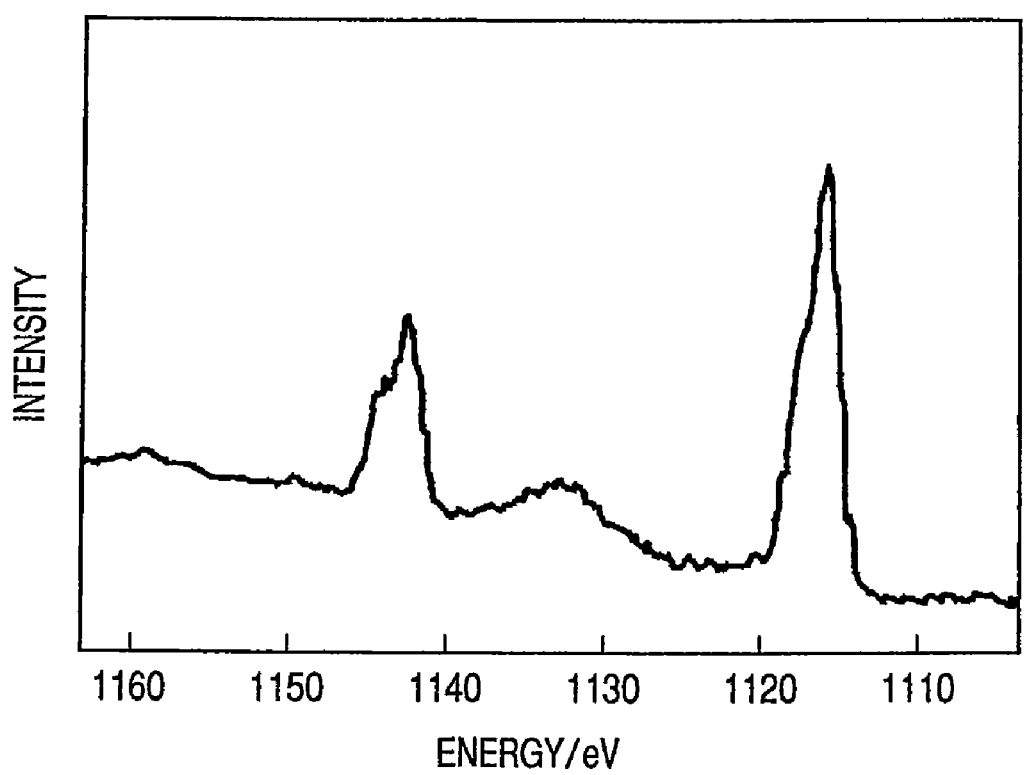
FIG. 3 is a view illustrating a result of an XPS surface analysis in a second embodiment of the present invention.

In addition to Ga, C, and the like, were also detected. When the peak vicinity showing Ga was enlarged-displayed, the result of the XPS surface analysis illustrated in FIG. 3 was obtained.

The peak showing a Ga metal was confirmed in the range of 1110 to 1120 eV (1116 to 1117 eV vicinity).

Next, this substrate was subjected to the reactive ion etching under the condition equal to that in example 1.

When this was confirmed by the optical microscope and the scanning electron microscope (SEM), it was found that the pattern surface 2a was flat, and the width W=about 100 nm, and the depth d=about 22 μm.

It was confirmed that the substrate was similarly etched to the 100 μm square area for estimation formed on the end of the substrate.

The reason why the etching depth is slightly deeper as compared to that in example 1 is because it is considered that the a natural oxide film at the position at which ions are not irradiated is removed.

It was found that the ion irradiation area 15 was flat even after etching and had a mask effect by the Ga ion irradiation.

Example 3

In an example 3, one example of manufacturing the nano structure as illustrated in FIGS. 5A, 5B, and 5C will be described.

As a substrate 21, Si was used. The pattern width W was taken as 2 μm, a dose pitch d=500 nm, an overlap taken as 0 percent, and an etching depth taken as 2 μm.

Since the nano structure manufacturing method in the present example is basically by the same process as the manufacturing method of the nano structure illustrated in FIGS. 5A, 5B, and 5C as described in the above-described embodiment of the present invention, a description will be made here also by using FIGS. 5A, 5B, and 5C.

First, the Si substrate 21 was set to the focused ion beam (FIB) apparatus (FIG. 5A). At that time, the Si substrate 21 was set so as to be vertical to the focused ion beam (FIB) 24.

Although the focused ion beam (FIB) 24 is suitably adjusted in advance, before the irradiation, accuracy was confirmed in the substrate edge vicinity. Five irradiation areas of 10 µm in length, a width W=2 µm, and a pitch d=500 nm and two irradiation areas of 100 pan square for estimation at the end of the substrate were set in the center, and the irradiation was performed by the focused ion beam (FIB), and seven ion beam irradiation areas 25 were fabricated on the surface of the substrate 21.

The condition at the irradiation time was based on the accelerating voltage of 30 kV and the beam current of 5 nA, and the irradiation time was adjusted such that the etching of about 50 nm was performed in the ordinary Si substrate processing (FIG. 5B).

After the irradiation, when the beam was confirmed again at the substrate edge vicinity, it was processed highly accurately.

Next, the substrate 21 on which the ion beam irradiation area 25 was fabricated by the focused ion beam (FIB) was taken out to perform an XPS surface analysis.

The ion beam irradiation area 25 had Ga detected, and the Ga amount for Si was about 7 atomic percent.

In addition to Ga, 0, C, and the like, were also detected.

Next, this substrate 21 was set to the reactive ion etching apparatus, and a reactive ion etching 26 was performed in a fluorine (F) atmosphere.

The introduced gas was alternatively introduced as $SF_6$ and $C_4F_8$, and an etching for about two minutes was performed (FIG. 5C).

By using such gases, the side wall protection by the etching and the pattern can be alternatively performed, and it is, therefore, possible to obtain a good vertical deep dig pattern by this etching.

When the substrate 21 was taken out from the apparatus, and the etching depth was confirmed by the optical microscope, the depth was about 2 µm. Further, when the micro pattern of the substrate center portion was confirmed by the scanning electron microscope (SEM), it was found that the pattern surface 22a has concavo-convexes at a pitch of 500 nm, and has a width W=2 µm, and a depth D=about 2 µm.

It was confirmed that the pattern surface is etched equivalent to the 200 µm square irradiation area for estimation formed at the end of the substrate.

Comparison Example 2

In a comparative example 2, the substrate equal to that in example 3 was used, and an equal processing area was set, thereby, the Ga ion beam irradiation was performed.

The accelerating voltage was set to 30 kV and the beam current was set to 5 nA, and a processing condition was adjusted such that the dose pitch becomes 50 nm and the overlap becomes 50 percent.

Next, this substrate was subjected to the reactive ion etching under the condition equal to that in example 1.

When this was confirmed by the optical microscope and the scanning electron microscope (SEM), it was found that a pattern having a flat surface is obtained.

It was found that the etching depth is 2 µm similarly to example 3.

Example 4

Figure 7:
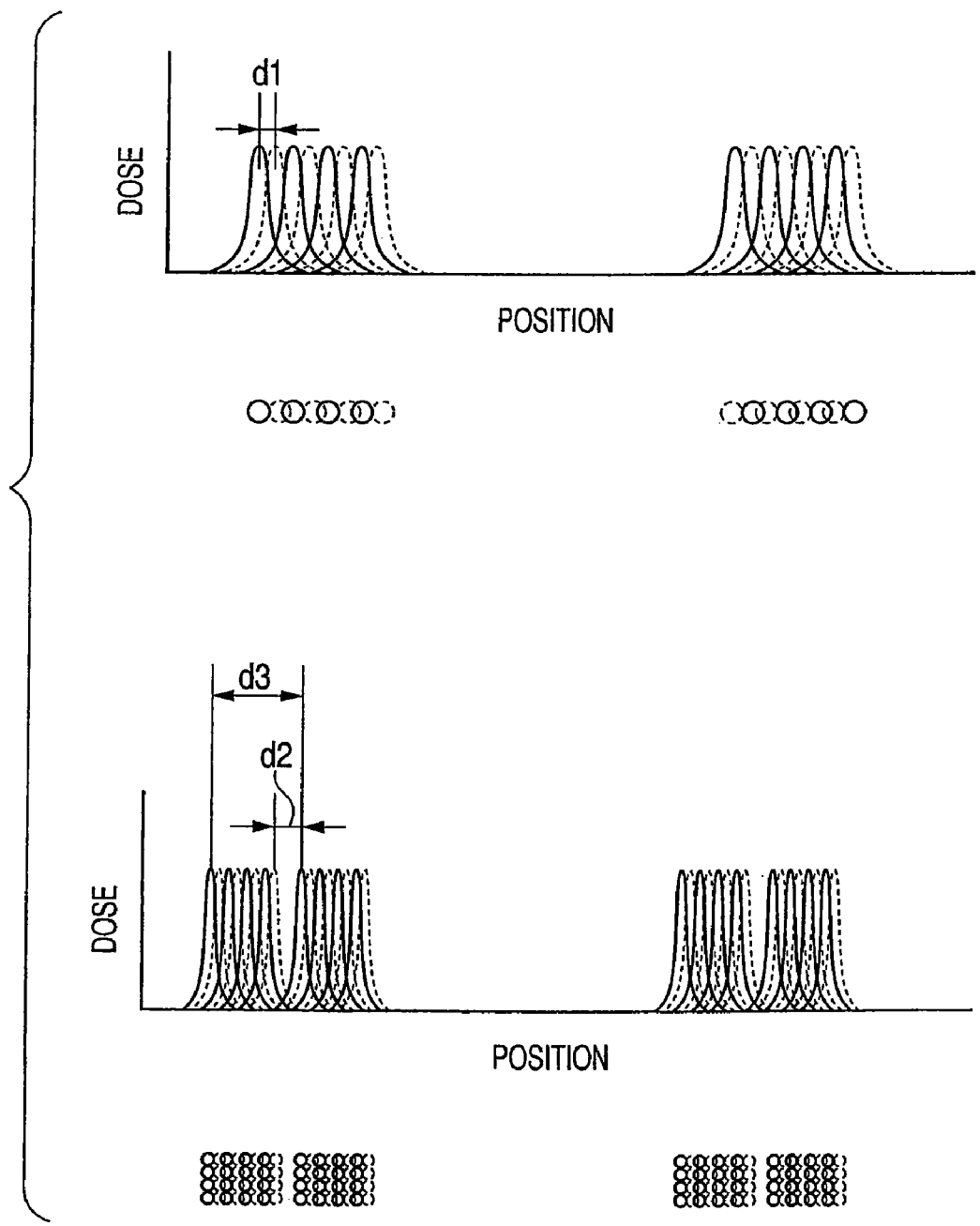
FIG. 7 is a schematic illustration illustrating one example of an FIB irradiation condition in a fourth embodiment of the present invention.

In an example 4, a substrate equal to that in example 3 was used, and an ion beam irradiation was performed under the condition as illustrated in FIG. 7.

That is, a dose pitch d1=100 nm, an area with no irradiation d2=600 nm, a repeated dose frequency d3=2.6 µm, and an etching depth D=20 µm.

Another condition was such that the Ga ion irradiation was performed under the condition equal to that in example 1.

Figure 8A:
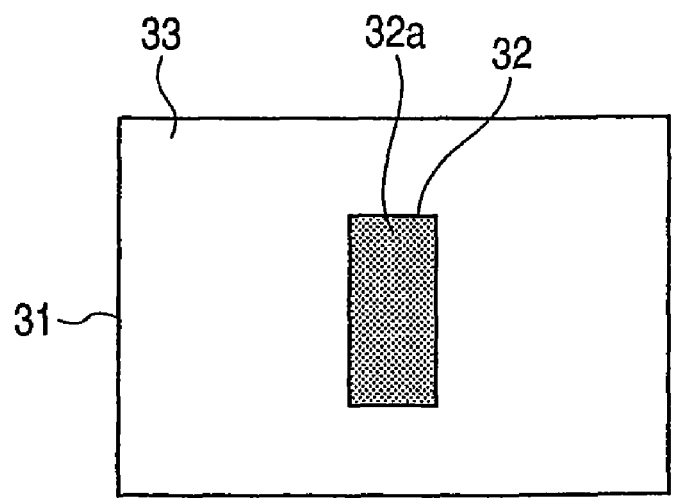
FIGS. 8A and 8B are views describing one example of a nano structure in a fourth embodiment of the present invention.
Figure 8B:
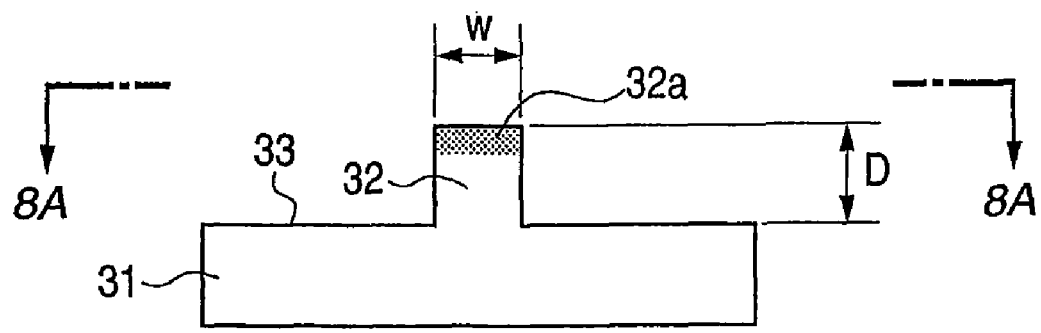

Next, this substrate was subjected to the reactive ion etching for about twenty minutes under the condition equal to the example 3. When this was confirmed by the optical microscope and the scanning electron microscope (SEM), it was found that the pattern surface 22a has a width W=about 100 nm and a depth D=about 20 µm, as illustrated in FIGS. 8A and 8B. In FIGS. 8A and 8B, reference numeral 31 denotes a substrate, reference numeral 32 a pattern, reference numeral 32a a pattern surface, and reference numeral 33 an etching bottom. It was confirmed that the pattern surface is etched equivalent to a 200 µm square irradiation area for estimation formed at the end of the substrate.

Example 5

Figure 9A:
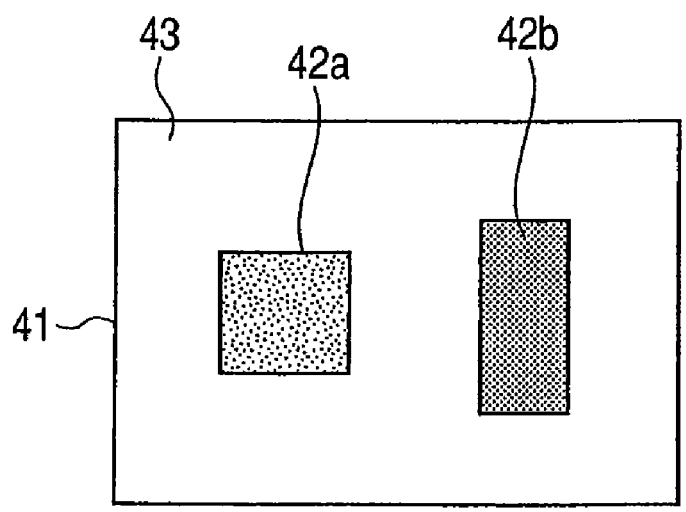
FIGS. 9A and 9B are views describing one example of a nano structure in a fifth embodiment of the present invention.
Figure 9B:
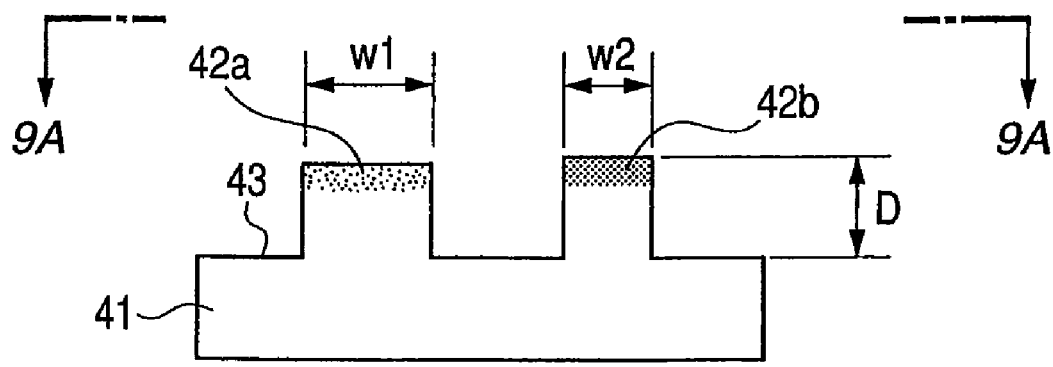

In an example 5, a substrate equal to that in the example 3 was used, and a pattern as illustrated in FIGS. 9A and 9B was formed. In FIGS. 9A and 9B, reference numeral 41 denotes a substrate, reference numerals 42a and 42b denote an irradiation area of the focused ion beam (FIB), and reference numeral 43 denotes an etching bottom.

The irradiation area 42a of the focused ion beam (FIB) had a processing condition adjusted under the condition equal to that in example 1 such that a dose pitch becomes 50 nm and an overlap becomes 50 percent.

Next, this substrate was subjected to the reactive ion etching for about twenty minutes under the condition equal to that in example 3.

When this was confirmed by the optical microscope and the scanning electron microscope (SEM), a pattern having concavo-convexes on the surface and a flat surface were confirmed.

The etching depth D of both patterns was about 20 µm.

Example 6

In an example 6, a method of manufacturing a nano structure (three dimensional structure) according to an aspect different from the above-described examples will be described.

FIGS. 11A to 11G illustrate cross-sectional views describing the method of manufacturing the nano structure (three dimensional structure) in the present example.

In FIGS. 11A to 11G, reference numeral 101 denotes a silicon substrate, reference numeral 102 denotes an aluminum thin film, reference 103 denotes a resist pattern, reference numeral 104 denotes a groove pattern, reference numeral 105 denotes an etching mask, and reference numeral 106 denotes a nano structure.

Figure 11A:
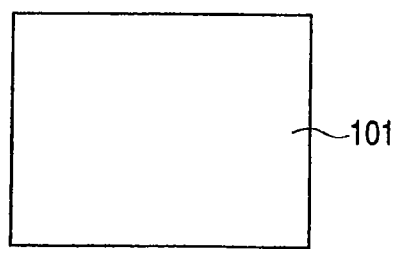
FIGS. 11A, 11B, 11C, 11D, 11E, 11F and 11G are views describing one example of a manufacturing method of nano structures (three dimensional structures) in sixth and eighth embodiments of the present invention.

First, the substrate 101 made of silicon is prepared (FIG. 11A).

Figure 11E:
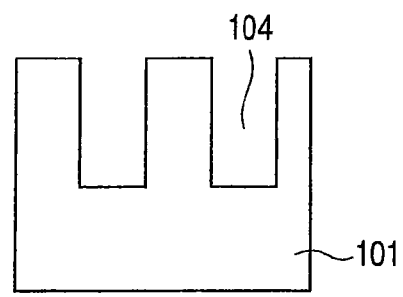
Figure 11B:
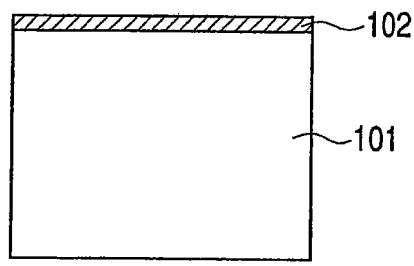

Next, on the silicon substrate 101, for example, the aluminum thin film 102 is deposited with a thickness of 200 nm by an EB evaporation method (FIG. 11B).

Figure 11F:
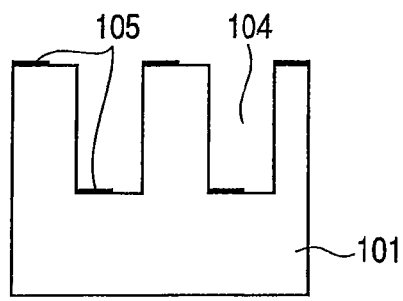
Figure 11C:
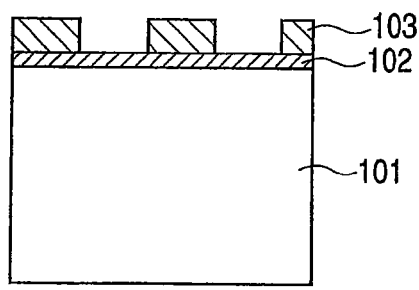

Next, on the silicon substrate 101, a photo resist film is coated and formed, and by performing an exposure and a development, a resist pattern 103 is formed (FIG. 11C).

At this time, a pattern of a positioning mark (not shown) used for exposure is also formed.

Next, with this resist pattern taken as an etching mask, the aluminum thin film 102 is subjected to patterning by using a chlorine gas based reactive dry etching.

Figure 11G:
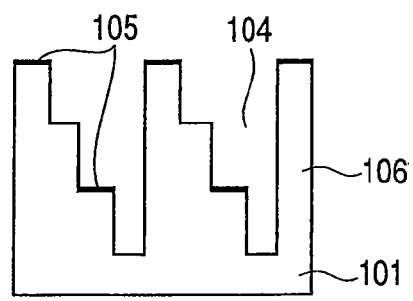
Figure 11D:
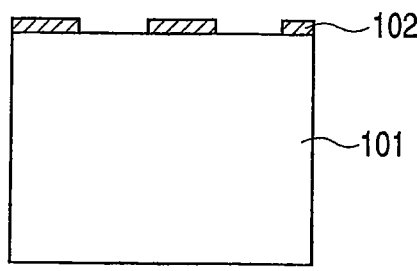

After that, when the resist pattern 103 is removed, for example, by using a resist stripping liquid, a pattern made of the aluminum thin film 102 is formed (FIG. 11D).

Next, with a pattern made of the aluminum thin film 103 taken as an etching mask, the silicon substrate 101 is formed with the groove pattern 104.

For example, by using a deep dig RIE (Deep Reactive Ion Etching) applied with a process of alternatively using a $SF_6$ gas and a $C_4F_8$ gas, the silicon substrate 101 is formed with the groove pattern 104 having a width of 200 nm, a pitch of 200 nm, and a depth of 4 μm.

A pattern made of the aluminum thin film 102 is removed by a wet etching, and stepped patterns of two stages are formed on the silicon substrate 101 (FIG. 11E).

Next, by using the above-described positioning mark (not shown), while performing a positioning, an etching mask 105 made of a portion containing Ga is formed on a desired position on the stepped pattern of the silicon substrate, while irradiating the focused ion beam (FIB) of Ga by the substrate in-plane scan.

The forming condition of this etching mask 105 is, for example, that the focused ion beam (FIB) of Ga is based on the accelerating voltage of 30 kV and a beam current of 500 nA.

At this time, the deep distribution peak of the Ga ion inside the substrate becomes about several tens of nm from the surface (pattern surface) of the silicon substrate 101.

Next, with a portion containing the Ga ion taken as the etching mask 105, a deep dig RIE is performed in order to subject the silicon substrate 101 to a deep dig processing (FIG. 11F).

By this deep dig RIE, the nano structures 106 of three stages can be formed on the silicon substrate 101 with a width of 100 nm, a pitch of 200 nm, a depth of 4 μm, and a structure depth of 10 μm for each one stage (FIG. 11G).

This deep dig RIE is applied, for example, with a Bosch process of alternatively using an $SF_6$ gas and a $C_4F_8$ gas, so that the etching mask can be made thin.

That is, an etching selection ratio of the silicon substrate 101 and the etching mask 105 can be increased, and this makes the thickness of the etching mask sufficient, even when it is about several tens of nm.

In the present invention, the depth distribution peak of the Ga ions is the uppermost layer of the substrate, that is, preferably, 0 to 50 nm, and more preferably, 0 to 30, and most suitably, the peak is at the depth of 0 to 20 nm.

By using such gases, the sidewall protection by the etching and the pattern can be alternatively performed, and it is, therefore, possible to obtain a good vertical deep dig pattern by this etching.

Note that, according to need, the Ga contained in the Ga ion containing portion 105 on the silicon substrate 101 is, for example, heated up to about 600° C. by an oven, and after that, may be removed by performing an etching by a hydrochloric acid solution.

As described above, in the forming method of the nano structure according to the present example, the etching mask used for the three dimensional processing can be formed on an arbitrary place on the step by the Ga focused ion beam. Hence, the nano structure having a high aspect stepped pattern can be manufactured.

Example 7

In an example 7, a description will be made of the method of manufacturing a nano structure (three dimensional structure) having the stepped patterns of plural stages according to an aspect further different from the above-described examples.

FIGS. 12A to 12H illustrate cross-sectional views describing the manufacturing method of the nano structure (three dimensional structure) in the present example.

In FIGS. 12A to 12H, reference numeral 201 is a silicon substrate, reference numeral 202 denotes an aluminum thin film, reference numeral 203 denotes a resist pattern, reference numeral 204 denotes an aperture pattern, reference numeral 205 denotes an etching mask, reference numeral 206 denotes an aperture, and reference numeral 207 denotes a nano structure.

Figure 12A:
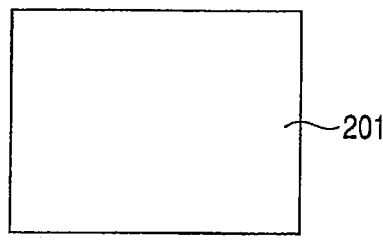
FIGS. 12A, 12B, 12C, 12D, 12E, 12F, 12G and 12H are views describing the method of manufacturing the three dimensional structure in seventh and ninth embodiments of the present invention.

First, a silicon substrate 201 is prepared (FIG. 12A).

Figure 12E:
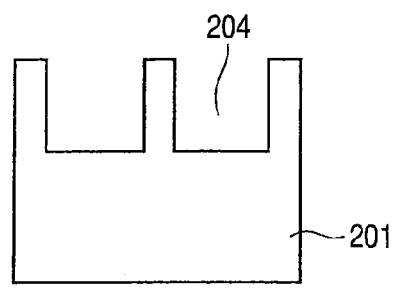
Figure 12B:
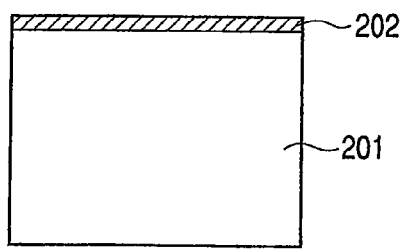

Next, on the silicon substrate 201, for example, the aluminum thin film 202 is deposited with, for example, a thickness of 200 nm by an EB evaporation method (FIG. 12B).

Figure 12F:
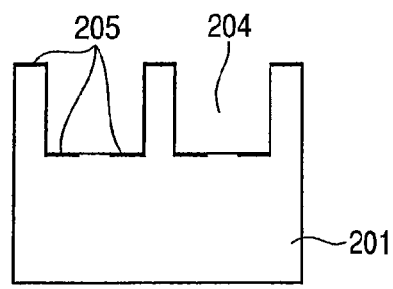
Figure 12C:
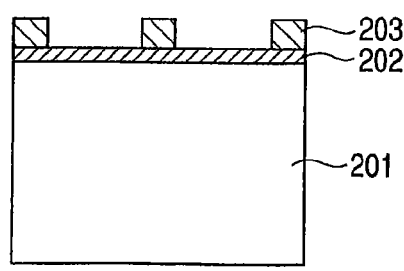

Next, on the silicon substrate 201, a photo resist film is coated and formed, and by performing an exposure and a development, a resist pattern 203 is formed (FIG. 12C).

At this time, a pattern of a positioning mark (not shown) used for exposure is also formed.

Next, with this resist pattern taken as an etching mask, the aluminum thin film 202 is subjected to patterning by using a chlorine gas based reactive dry etching.

Figure 12G:
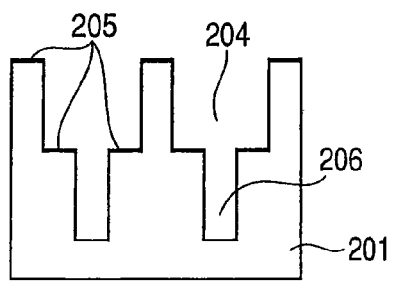
Figure 12D:
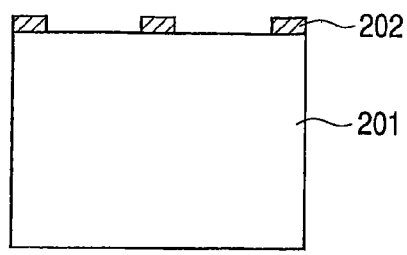

After that, when the resist pattern 203 is removed, for example, by using a resist stripping liquid, a pattern made of the aluminum thin film 202 is formed (FIG. 12D).

Next, with a pattern made of the aluminum thin film 203 taken as an etching mask, for example, by using a deep RIE (Reactive Ion Etching) applied with a Bosch process of alternatively using a $SF_6$ gas and a $C_4F_8$ gas, a deep dig processing is performed.

As a result, the silicon substrate 201 is formed with the aperture pattern 204 having a diameter of 300 nm, a pitch of 500 nm, and a depth of 4 μm.

A pattern made of the aluminum thin film 202 is removed by a wet etching, and stepped patterns of two stages are formed on the silicon substrate (FIG. 12E).

Next, by using the above-described positioning mark (not shown), while a positioning is performed, an etching mask 205 made of a Ga containing portion is formed on a desired position on the stepped pattern of the silicon substrate, while irradiating the focused ion beam (FIB) of Ga by the substrate in-plane scan (FIG. 12F).

The forming condition of this etching mask 205 is, for example, such that the focused ion beam (FIB) of Ga is based on the accelerating voltage of 30 kV and the beam current of 500 nA.

At this time, the depth distribution peak of the Ga ions inside the substrate becomes about several tens of nm from the surface of the silicon substrate 201.

Next, with a portion containing the Ga ions taken as the etching mask 205, the silicon substrate 201 is subjected to the Deep RIE (Reaction Ion Etching), thereby to form the aperture 206 of 6 μm in depth in the center of the aperture pattern 204 (FIG. 12G).

This deep RIE is applied, for example, with a Bosch process of alternatively using an $SF_6$ gas and a $C_4F_8$ gas, so that the etching mask can be made thin.

That is, an etching selection ratio of the silicon substrate 201 and the etching mask 205 can be increased, and this makes the thickness of the etching mask sufficient, even when it is about several tens of μm.

In the present invention, the depth distribution peak of the Ga ions is the uppermost layer of the substrate, that is, preferably, 0 to 50 nm, and more preferably, 0 to 30 nm, and most suitably, the peak is at the depth of 0 to 20 nm.

By using such gases, the sidewall protection by the etching and the pattern can be alternatively performed, and it is, therefore, possible to obtain a good vertical deep dig pattern by this etching.

Next, the Ga contained in the Ga ion containing portion on the silicon substrate 201 is, for example, heated up to about 600° C. by an oven, and after that, is removed by performing an etching by a hydrochloric acid solution.

Figure 12H:
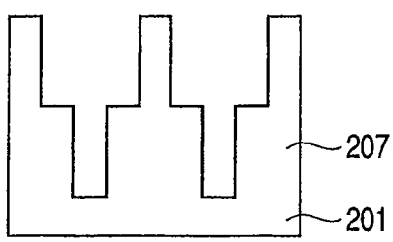

As a result, the silicon substrate 201 can be formed with the nano structures 207 of two stages having an aperture center of 100 nmΦ, a pitch of 400 nm, and a depth of 8 µm (FIG. 12H).

Note that, by repeating the method of manufacturing the nano structure at least once or more times, the nano structure having the stepped pattern further increased in steps may be manufactured.

As described above, in the forming method of the three dimensional structure in the present example, the etching mask used for three dimensional processing can be formed on an arbitrary place on the step by the Ga focused ion beam.

As a result, the nano structure having a high aspect stepped pattern can be formed.

Next, an example will be described in which, with the nano structure by this silicon substrate taken as a mold, the nano structure inverting this mold is formed on a separate substrate by an imprint method.

FIGS. 13A, 13B, 13C, and 13D illustrate views describing a forming example by the imprint method.

In FIGS. 13A, 13B, 13C, and 13D, reference numeral 310 denotes a synthetic quartz substrate, reference numeral 302 denotes a resin, reference numeral 303 denotes a nano structure by the silicon substrate serving as a mold, and reference numeral 304 denotes pressure.

Further, reference numeral 305 denotes a three dimensional structure made of resin transferred by the mold.

Figure 13A:
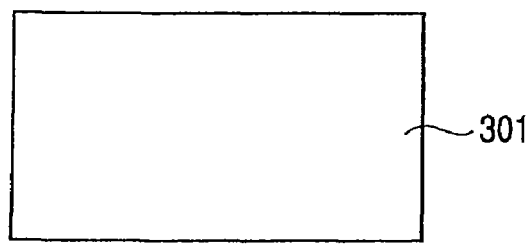
FIGS. 13A, 13B, 13C and 13D are views describing an example of forming a nano structure on a separate substrate by an imprint method with the nano structure in the seventh and ninth embodiments of the present invention taken as a mold.

First, as a substrate for forming the nano structure of a shape inverting the mold, for example, the synthetic quartz substrate 301 is prepared (FIG. 13A).

Figure 13B:
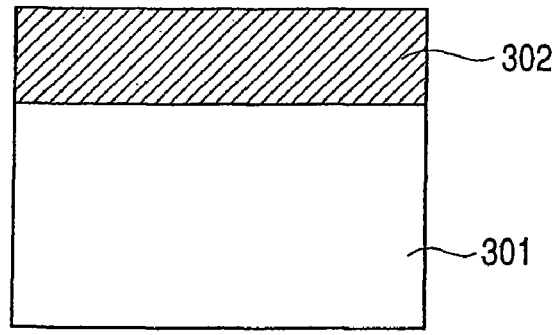

Next, for example, PMMA (Polymethylmethacrylate) is coated on the synthetic quartz substrate 301 as the resin 302 to be imprinted, and after that, for example, it is heated up to 110° C. or more (FIG. 13B).

Figure 13C:
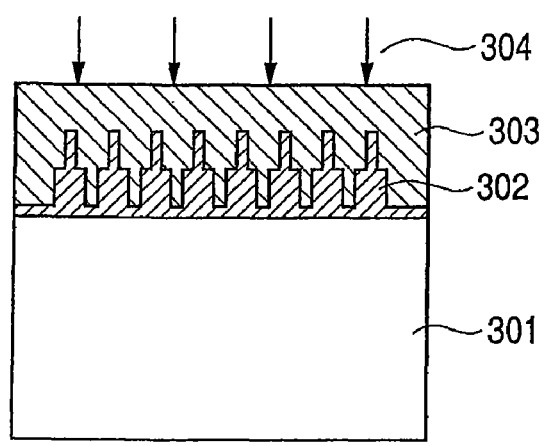

Next, the resin 302 softened by heating is pressed with the nano structure 303 serving as the mold by a pressure 304 of about several mega Pascal (FIG. 13C).

Figure 13D:
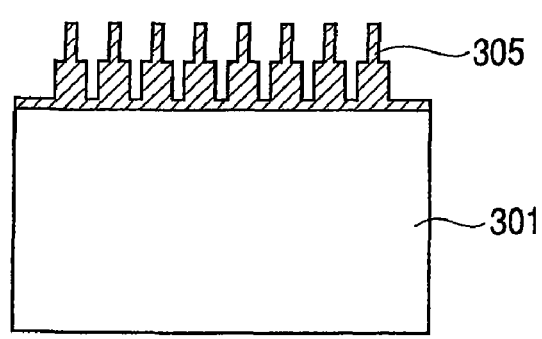
Figure 14:
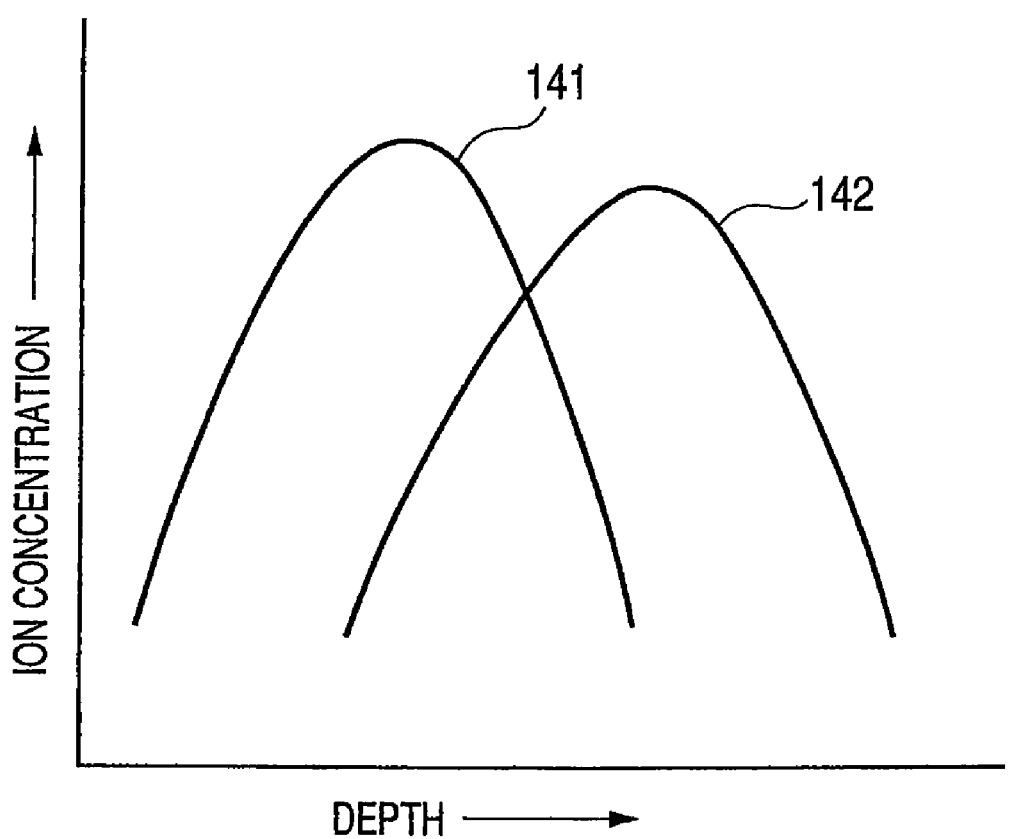
FIG. 14 is a diagram illustrating a difference in a depth profile of an ion concentration by a difference in an accelerating voltage in U.S. Pat. No. 5,236,547, which is a conventional example.
Figure 15A:
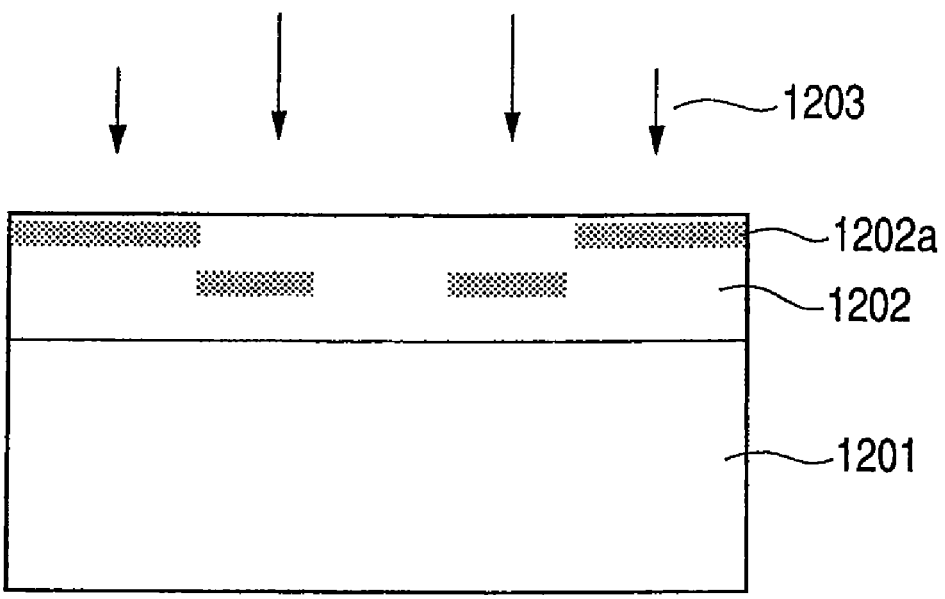
FIGS. 15A and 15B are sectional views illustrating a stepped pattern forming process in U.S. Pat. No. 5,326,547, which is a conventional example.
Figure 15B:
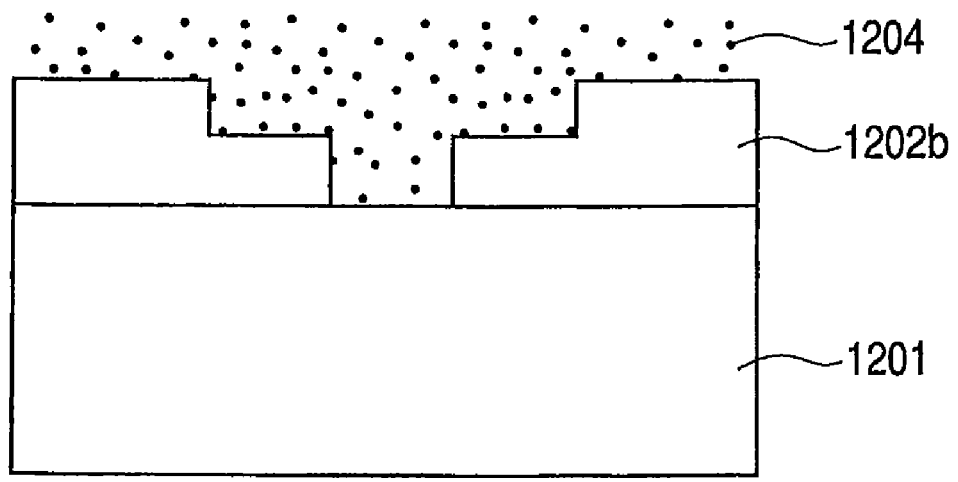
Figure 17:
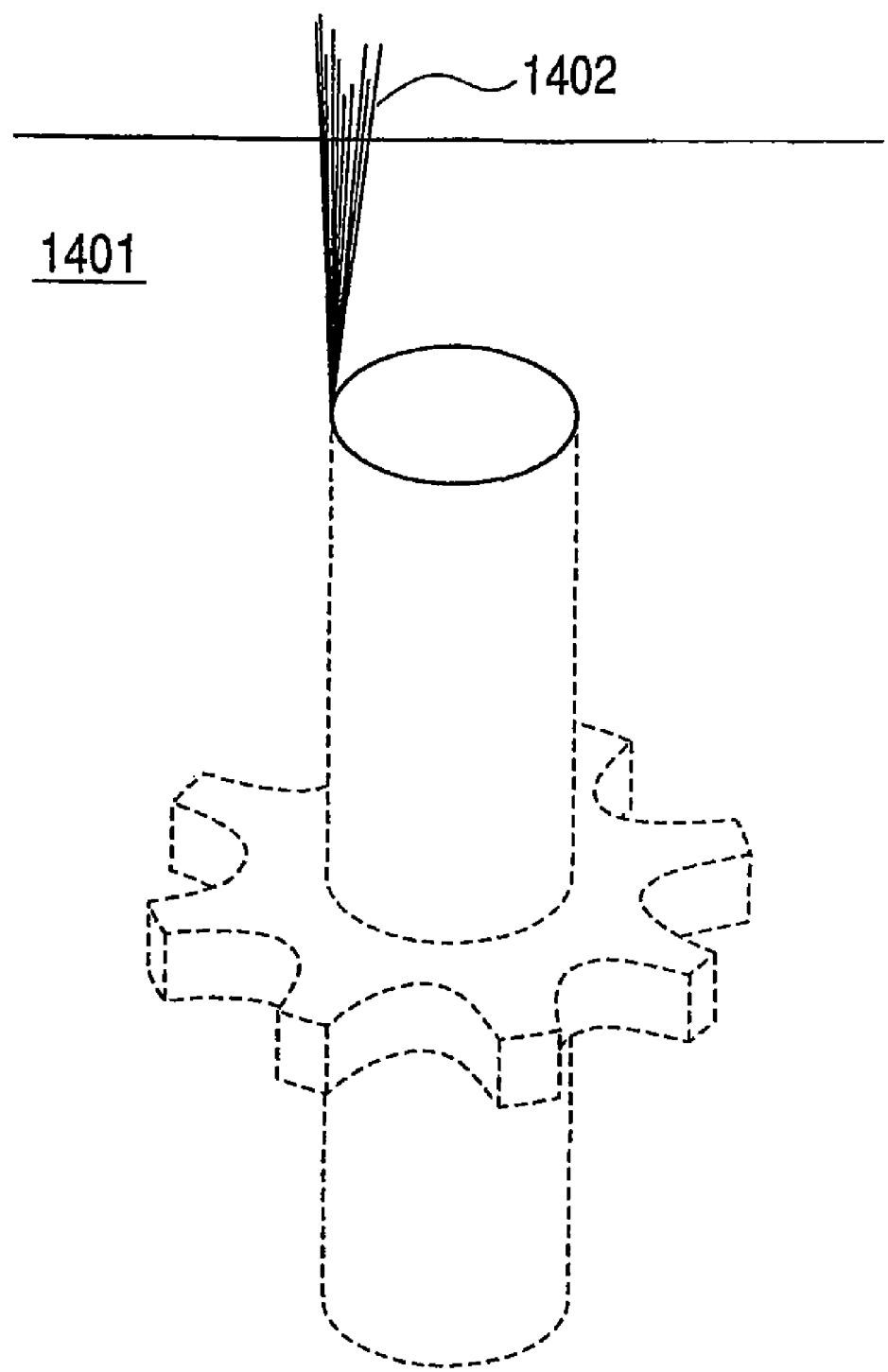
FIG. 17 is an explanatory drawing schematically illustrating a fabrication of the combination of an axis and a gear wheel by the focused ion beam of the conventional example in Japanese Patent Application Laid-Open No. H04-190984, which is a conventional example.
Figure 18A:
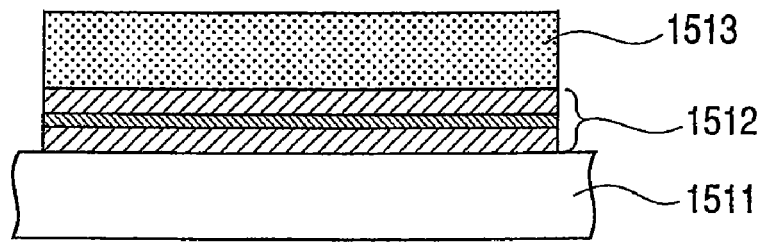
FIGS. 18A, 18B, and 18C are cross-sectional views for describing the method of manufacturing a magneto resistance effect film in Japanese Patent Application Laid-Open No. 2002-368307, which is a conventional example.
Figure 18B:
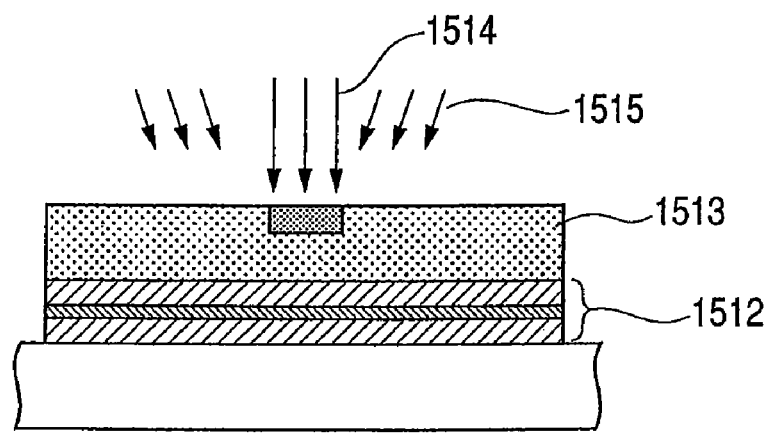
Figure 18C:
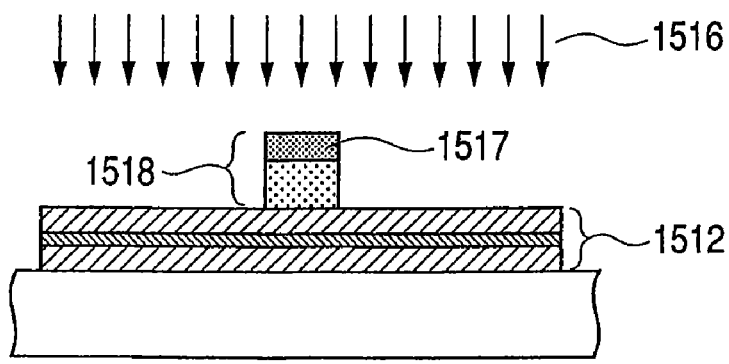
Figure 19A:
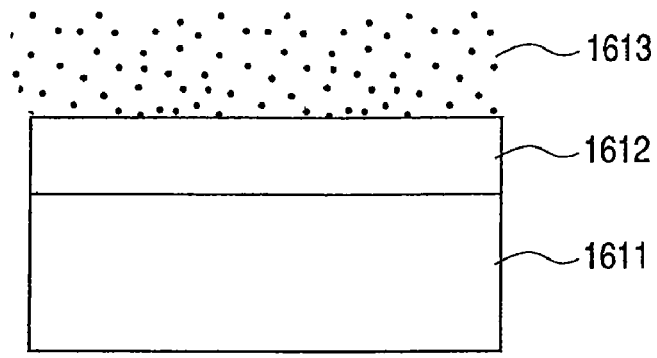
FIGS. 19A, 19B, and 19C are cross-sectional views illustrating a mask pattern forming process in U.S. Pat. No. 5,236,547, which is a conventional example.
Figure 19B:
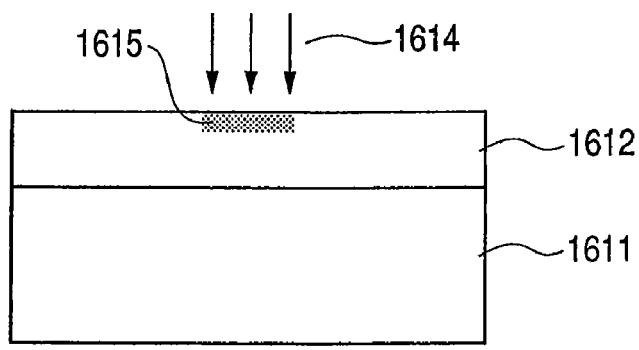
Figure 19C:
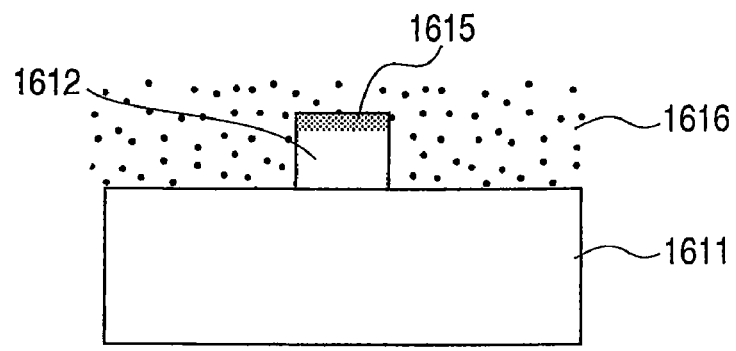
Figure 20A:
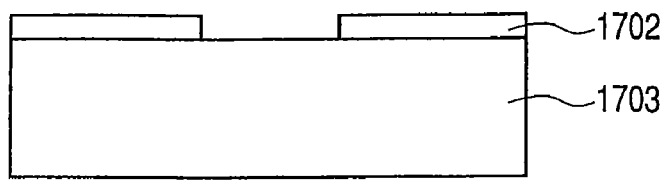
FIGS. 20A, 20B, 20C, and 20D are process drawings for describing an etching method in Japanese Patent Application No. S58-151027, which is a conventional example.
Figure 20B:
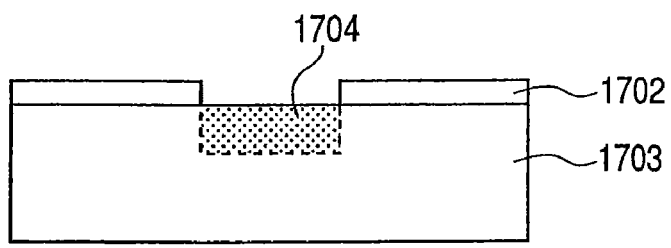
Figure 20C:
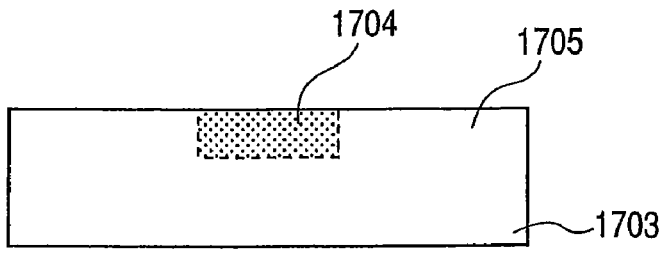
Figure 20D:
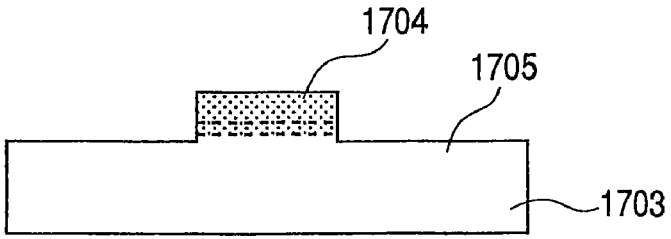
Figure 21:
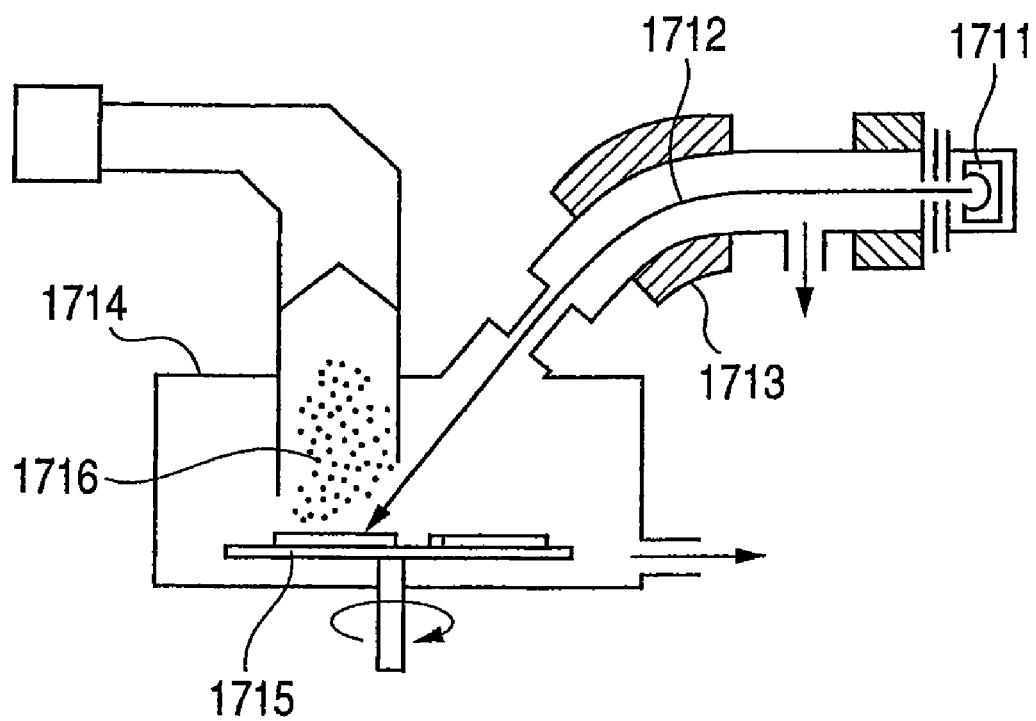
FIG. 21 is a view of an apparatus capable of performing an ion implanting and a plasma etching in parallel in Japanese Patent Application No. S58-151027, which is a conventional example.

Next, the substrate adhered with the nano structure 303 serving as the mold is subjected to the dry etching by a xenon difluoride ($XeF_2$) gas, thereby, to remove this mold 303. As a result, on the substrate 301, the three dimensional structure 305 made of resin having a shape inverting the mold 303 is transferred (FIG. 13D).

Although some residual films exist on the bottom of the three dimensional structure 305 made of the resin, according to need, the residual films may be removed by performing a descum treatment by oxygen ashing.

The removal of the mold of the nano structure 303 may be performed by deposition of a release agent on the mold before the pressing of the substrate and the stripping of the mold after the mold pressing in addition to the above removal.

Example 8

In an example 8, the method of manufacturing the nano structure (three dimensional structure) by the aspect different from the above-described example will be described.

FIGS. 11A to 11G illustrate cross-sectional views describing the manufacturing method of the nano structure (three dimensional structure) in the present example.

In FIGS. 11A to 11G, reference numeral 101 denotes a silicon substrate, reference numeral 102 denotes an aluminum thin film, reference numeral 103 denotes a resist pattern, reference numeral 104 denotes a groove pattern, reference numeral 105 denotes an etching mask, and reference numeral 106 denotes a nano structure.

First, a substrate 101 made of silicon is prepared (FIG. 11A).

Next, on the silicon substrate 101, for example, the aluminum thin film 102 is deposited with, for example, a thickness of 200 nm by an EB evaporation method (FIG. 11B).

Next, on the silicon substrate 101, a photo resist film is coated and formed, and by performing an exposure and a development, a resist pattern 103 is formed (FIG. 11C).

At this time, a pattern of a positioning mark (not shown) used for exposure is also formed.

Next, with this resist pattern taken as an etching mask, the aluminum thin film 102 is subjected to patterning by using a chlorine gas based reactive dry etching.

After that, when the resist pattern 103 is removed, for example, by using a resist stripping liquid, a pattern made of the aluminum thin film 102 is formed (FIG. 11D).

Next, with a pattern made of the aluminum thin film 103 taken as an etching mask, the silicon substrate 101 is formed with the groove pattern 104.

For example, by using a deep dig RIE (Deep Reaction Ion Etching) applied with a process of alternatively using an $SF_6$ gas and a $C_4F_8$ gas, the silicon substrate 101 is formed with the groove pattern 104 having a width of 800 µm, a pitch of 1600 nm, and a depth of 8 µm.

A pattern made of the aluminum thin film 102 is removed by a wet etching, and a stepped pattern of one stage is formed on the silicon substrate 101 (FIG. 11E).

Next, by using the above-described positioning mark (not shown), while a positioning is performed, an etching mask 105 made of a Ga containing portion is formed on a desired position on the stepped pattern of the silicon substrate, while irradiating the focused ion beam (FIB) of Ga by the substrate in-plane scan.

The forming condition of this etching mask 105 is, for example, such that the focused ion beam (FIB) of Ga is based on the accelerating voltage of 30 kV and the beam current of 5 nA.

At this time, the depth distribution peak of the Ga ion inside the substrate becomes about several tens of nm from the surface (pattern surface) of the silicon substrate 101.

Next, with a portion containing the Ga ion taken as the etching mask 105, a deep dig RIE is performed in order to subject the silicon substrate 101 to a deep dig processing (FIG. 11F). The etching depth at this time is 4 µm. By this deep dig RIE, three stages of the nano structure 106 can be formed on the silicon substrate 101 with a width of 400 nm, a depth of 4 µm, a structure depth of 12 µm, and a pitch of 1600 nm for each stage (FIG. 11G).

This deep dig RIE is applied, for example, with a process of alternatively using an $SF_6$ gas and a $C_4F_8$ gas, so that the etching mask can be made thin.

That is, an etching selection ratio of the silicon substrate 101 and the etching mask 105 can be increased, and this makes the thickness of the etching mask sufficient, even when it is about several tens of nm.

In the present invention, the depth distribution peak of the Ga ions is the uppermost layer of the substrate, that is, preferably, 0 to 50 nm, and more preferably, 0 to 30 nm, and most suitably, the peak is at the depth of 0 to 20 nm.

By using such gases, the sidewall protection by the etching and the pattern can be alternatively performed, and it is, therefore, possible to obtain a good vertical deep dig pattern by this etching.

Note that, according to need, the Ga contained in the Ga ion containing portion 105 on the silicon substrate 101 is, for example, heated up to about 600° C. by an oven, and after that, may be removed by performing an etching by a hydrochloric acid solution.

As described above, in the method of forming the nano structure according to the present example, the etching mask used for the three dimensional processing can be formed on an arbitrary place on the step by the Ga focused ion beam.

Hence, the nano structure having a high aspect stepped pattern can be manufactured.

Example 9

In example 9, the method of manufacturing the nano structure (three dimensional structure) having the stepped patterns of plural stages by the aspect further different from the above-described example will be described.

FIGS. 12A to 12H illustrate cross-sectional views describing the manufacturing method of the nano structure (three dimensional structure) in the present example.

In FIGS. 12A to 12H, reference numeral 201 denotes a silicon substrate, reference numeral 202 denotes an aluminum thin film, reference numeral 203 denotes a resist pattern, reference numeral 204 denotes an aperture pattern, reference numeral 205 denotes an etching mask, reference numeral 206 denotes an aperture, and reference numeral 207 denotes a nano structure.

First, a silicon substrate 201 is prepared (FIG. 12A).

Next, on the silicon substrate 201, for example, the aluminum thin film 202 is deposited with, for example, a thickness of 200 nm by an EB evaporation method (FIG. 12B).

Next, on the silicon substrate 201, a photo resist film is coated and formed, and by performing an exposure and a development, a resist pattern 203 is formed (FIG. 12C).

At this time, a pattern of a positioning mark (not shown) used for exposure is also formed.

Next, with this resist pattern taken as an etching mask, the aluminum thin film 202 is subjected to patterning by using a chlorine gas based reactive dry etching.

After that, when the resist pattern 203 is removed, for example, by using a resist stripping liquid, a pattern made of the aluminum thin film 202 is formed (FIG. 12D).

Next, with a pattern made of the aluminum thin film 203 taken as an etching mask, for example, by using a deep ME (Deep Reactive Ion Etching) applied with a Bosch process of alternatively using an $SF_6$ gas and a $C_4F_8$ gas, a deep dig processing is performed.

As a result, the silicon substrate 201 is formed with the aperture pattern 204 having a diameter of 300 nm, a pitch of 400 nm, and a depth of 5 μm.

A pattern made of the aluminum thin film 202 is removed by wet etching, and a stepped pattern of one stage is formed on the silicon substrate (FIG. 12E).

Next, by using the above-described positioning mark (not shown), while a positioning is performed, an etching mask 205 made of a Ga containing portion is formed on a desired position on the stepped pattern of the silicon substrate, while irradiating the focused ion beam (FIB) of Ga by the substrate in-plane scan (FIG. 12F).

The forming condition of this etching mask 205 is, for example, such that the focused ion beam (FIB) of Ga is based on the accelerating voltage of 30 kV and the beam current of 5 nA.

At this time, the depth distribution peak of the Ga ions inside the substrate becomes about several tens of nm from the surface of the silicon substrate 201.

Next, with a portion containing the Ga ions taken as the etching mask 205, the silicon substrate 201 is subjected to the Deep RIE (Reactive Ion Etching), thereby to form the aperture 206 of 5 μm in depth in the center of the aperture pattern 204 (FIG. 12G).

This deep RIE is applied, for example, with a Bosch process of alternatively using an $SF_6$ gas and a $C_4F_8$ gas, so that the etching mask can be made thin.

That is, an etching selection ratio of the silicon substrate 201 and the etching mask 205 can be increased, and this makes the thickness of the etching mask sufficient, even if it is about several tens of nm.

In the present invention, the depth distribution peak of the Ga ions is the uppermost layer of the substrate, that is, preferably, 0 to 50 nm, and more preferably, 0 to 30 nm, and most suitably, the peak is at the depth of 0 to 20 nm.

By using such gases, the sidewall protection by the etching and the pattern can be alternatively performed, and it is, therefore, possible to obtain a good vertical deep dig pattern by this etching.

Next, the Ga contained in the Ga ion containing portion on the silicon substrate 201 is, for example, heated up to about 600° C. by an oven, and after that, is removed by performing an etching by a hydrochloric acid solution.

As a result, the silicon substrate 201 can be formed with the nano structures 207 of two stages having an aperture center of 100 nmΦ, a width of 100 nm for one stage, a depth of 5 μm for one stage, a structure depth of 10 μm and a pitch of 400 nm (FIG. 12H).

Note that, by repeating the manufacturing method of the nano structure at least once or more times, the nano structure having the stepped pattern further increased in steps may be manufactured.

As described above, in the forming method of the three dimensional structure according to the present example, the etching mask used for three dimensional processing can be formed on an arbitrary placed on the step by the Ga focused ion beam.

As a result, the nano structure having a high aspect stepped pattern can be formed.

Next, an example will be described, in which, with the nano structure by this silicon substrate taken as a mold, the nano structure inverting this mold is formed on a separate substrate by an imprint method.

FIGS. 13A, 13B, 13C, and 13D illustrate views describing a forming example by the imprint method.

In FIGS. 13A, 13B, 13C, and 13D, reference numeral 301 denotes a synthetic quartz substrate, reference numeral 302 denotes a resin, reference numeral 303 denotes a nano structure by the silicon substrate serving a mold, and reference numeral 304 denotes pressure.

Further, reference numeral 305 denotes a three dimensional structure made of resin transferred by the mold.

First, as a substrate for forming the nano structure of the shape inverting the mold, for example, the synthetic quartz substrate 301 is prepared (FIG. 13A).

Next, for example, PMMA (Polymethylmethacrylate) is coated on the synthetic quartz substrate 301 as the resin 302 to be imprinted, and, after that, for example, it is heated up to 110° C. or more (FIG. 13B).

Next, the resin 302 softened by heating is pressed with the nano structure 303 serving as the mold by a pressure 304 of about several mega Pascal (FIG. 13C).

Next, the substrate adhered with the nano structure 303 serving as the mold is subjected to dry etching by a xenon difluoride ($XeF_2$) gas, thereby to remove this mold 303. As a result, on the substrate 301, the three dimensional structure 305 made of resin having a shape inverting the mold 303 is transferred (FIG. 13D).

Although some residual films exist on the bottom of the three dimensional structure 305 made of the resin, according to need, the residual films may be removed by performing a descum treatment by oxygen ashing.

The removal of the mold of the nano structure 303 may be performed by deposition of a release agent on the mold before the pressing of the substrate and the stripping of the mold after the mold pressing in addition to the above removal.

As described above, in the forming method of the three dimensional structure according to the present example, the etching mask used for three dimensional processing can be formed on an arbitrary place on the step by the Ga focused ion beam.

Note that, in the above-described example, while the case has been illustrated in which the Ga metal is used as a liquid metal ion source for the focus ion beam, the same result can expected even when In is used as the liquid metal ion source, in addition to the Ga metal.

As a result, it is possible to manufacture a nano structure having a high aspect stepped pattern. Further, using this as a mold, it is possible to manufacture an inverted structure of the nano structure having a high aspect step on the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A nano structure formed on the surface of a substrate containing Si and having a pattern of at least 2 μm in depth, wherein Ga or In is contained in the surface of the pattern, and the Ga or the In has a concentration distribution that an elemental composition ratio Ga/Si or In/Si of Si and Ga or In detected by X-ray photoelectron spectroscopy is at least 0.4 atomic percent in the depth direction of the substrate, and the maximum value of the concentration is positioned within 50 nm of the surface of the pattern.

2. The nano structure according to claim 1, wherein a peak of the Ga detected by the X-ray photoelectron spectroscopy in the surface of the pattern is in a range of 1110 to 1120 eV.

3. The nano structure according to claim 1, wherein the pattern has a line width of at most 500 nm.

4. A nano structure formed on the surface of a substrate containing Si and having a pattern of at least 2 μm in depth, wherein Ga or In is contained in the surface of the pattern, and a maximum value of an ion concentration of the Ga or the In detected by Secondary Ion-Microprobe Mass Spectrometry (SIMS) is at least $5 \times 10^{14}/cm^2$, and the maximum value of the concentration is positioned within 50 nm in the depth direction of the surface of the pattern.

5. The nano structure according to claim 4, wherein a peak of the Ga detected by X-ray photoelectron spectroscopy in the surface of the pattern is in a range of 1110 to 1120 eV.

6. The nano structure according to claim 4, wherein the pattern has a line width of at most 500 nm.

7. The nano structure according to claim 4, wherein Ga is contained in the surface of the pattern.

* * * * *